United States Patent
Inoue

(10) Patent No.: US 8,749,275 B2
(45) Date of Patent: Jun. 10, 2014

(54) DIFFERENTIAL CIRCUIT

(75) Inventor: Fumihiro Inoue, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/811,477

(22) PCT Filed: Sep. 5, 2011

(86) PCT No.: PCT/JP2011/070185
§ 371 (c)(1),
(2), (4) Date: Jan. 22, 2013

(87) PCT Pub. No.: WO2012/036014
PCT Pub. Date: Mar. 22, 2012

(65) Prior Publication Data
US 2013/0120027 A1 May 16, 2013

(30) Foreign Application Priority Data
Sep. 15, 2010 (JP) .................................. 2010-207235

(51) Int. Cl.
*H03K 5/22* (2006.01)
(52) U.S. Cl.
USPC ........................................... 327/82; 327/563
(58) Field of Classification Search
USPC ............ 327/63, 71, 77, 82, 89, 561, 562, 563
See application file for complete search history.

(56) References Cited

U.S. PATENT DOCUMENTS

| | | | |
|---|---|---|---|
| 5,043,599 A | 8/1991 | Zitta | |
| 5,115,152 A * | 5/1992 | Nishimura | 327/62 |
| 6,707,333 B2 * | 3/2004 | Matsumoto et al. | 327/534 |
| 7,224,191 B1 * | 5/2007 | Wang et al. | 327/60 |
| 7,701,259 B2 * | 4/2010 | Pan | 327/58 |

FOREIGN PATENT DOCUMENTS

| | | |
|---|---|---|
| JP | 2-117208 | 5/1990 |
| JP | 2009-159344 | 7/2009 |

OTHER PUBLICATIONS

International Search Report mailed on Oct. 11, 2011.

* cited by examiner

*Primary Examiner* — Jeffrey Zweizig
(74) *Attorney, Agent, or Firm* — IPUSA, PLLC

(57) ABSTRACT

A differential circuit includes a first input part; a second input part; a reference voltage input part, the reference voltage input part being common to form differential pairs; a current source that drives the differential pairs; a current mirror that generates a first output current and a second output current, according to a current that flows through the reference voltage input part according to at least one voltage difference of first and second voltage differences; a first output part that outputs a signal according to the first voltage difference, according to a current that flows through the first input part according to the first voltage difference and the first output current; and a second output part that outputs a signal according to the second voltage difference, according to a current that flows through the second input part according to the second voltage difference and the second output current.

9 Claims, 20 Drawing Sheets 100-1

DIFFERENTIAL CIRCUIT

TECHNICAL FIELD

The present invention relates to a differential circuit that has a differential pair that compare input voltages and a reference voltage.

BACKGROUND ART

FIG. 1 shows a circuit configuration diagram of one example of a conventional oscillation circuit. In FIG. 1, a power source Vdd is connected to one end of a constant current circuit 101, and the sources of p-channel MOS transistors M101 and M103 are connected to the other end thereof. The drain of the MOS transistor 101 is connected to the drain of an n-channel MOS transistor M102, and the source of the MOS transistor M102 is connected to a power source Vss. Further, the drain of the MOS transistor M103 is connected to the drain of an re-channel MOS transistor M104, and the source of the MOS transistor M104 is connected to the power source Vss.

The drains of the MOS transistors M101 and M102 are connected to one end of a capacitor C101, and also, are connected to a non-inverting terminal of a comparator 1027, the other end of the capacitor C101 is connected to the power source Vss. The gates of the MOS transistors M101 and M102 are connected to the Q terminal of a RS flip-flop 104.

Further, the drains of the MOS transistors M103 and M104 are connected to one end of a capacitor C102, and also, are connected to a non-inverting terminal of a comparator 103, the other end of the capacitor C102 is connected to the power source Vss. The gates of the MOS transistors M103 and M104 are connected to the QB terminal of the RS flip-flop 104.

The inverting terminals of the comparators 102 and 103 are connected to one end of a constant voltage circuit 105, a reference voltage Vth is thus applied to the inverting terminals of the comparators 102 and 103, and the other end of the constant voltage circuit 105 is connected to the power source Vss. The current input terminal of the comparator 102 is connected to one end of a constant current circuit 106, thus an operation current is supplied to the comparator 102, and the other end of the constant current circuit 106 is connected to the power source Vss. The comparator 102 generates an output signal that has a high level when the voltage of the capacitor C101 exceeds the reference voltage Vth and has a low level when the voltage is less than or equal to the reference voltage Vth, and supplies the output voltage to the set terminal S of the flip-flop 104.

The current input terminal of the comparator 103 is connected to one end of a constant current circuit 107, thus an operation current is supplied to the comparator 103, and the other end of the constant current circuit 107 is connected to the power source Vss. The comparator 103 generates an output signal that has a high level when the voltage of the capacitor C102 exceeds the reference voltage Vth and has a low level when the voltage is less than or equal to the reference voltage Vth, and supplies the output voltage to the reset terminal R of the flip-flop 104.

The flip-flop 104 has a high level of the Q terminal output and a low level of the QB terminal output when a signal of a high level is supplied to the set terminal S. Further, the flip-flop 104 has a low level of the Q terminal output and a high level of the QB terminal output when a signal of a high level is supplied to the reset terminal R. One or both of the Q terminal output and the QB terminal output of the flip-flop 104 is (are) output as an oscillation signal.

<Operation>

When the Q terminal output of the flip-flop 104 (FIG. 2 (E)) has a low level, the MOS transistor M101 is turned on, the MOS transistor M102 is turned off, the capacitor 101 is thus charged (FIG. 2 (A)), and simultaneously, the QB terminal output of the flip-flop 104 has a high level (FIG. 2 (F)), the MOS transistor M103 is thus turned off, the MOS transistor M104 is turned on, and the capacitor 102 is thus discharged (FIG. 2 (C)). Then, when the voltage of the capacitor 101 has exceeded the reference voltage Vth, the output of the comparator 102 comes to have a high level (FIG. 2 (B)), the flip-flop 104 is set, the Q terminal output thus comes to have a high level and the QB terminal output comes to have a low level.

At this time, the capacitor C101 is discharged as a result of the MOS transistor M101 being turned off and the MOS transistor M102 being turned on, and, simultaneously, the QB terminal output comes to have a low level, and the capacitor C102 is charged as a result of the MOS transistor M103 being turned on and the MOS transistor M104 being turned off. Then, when the voltage of the capacitor 102 has exceeded the reference voltage Vth, the output of the comparator 103 comes to have a high level (FIG. 2 (D)), the flip-flop 104 is reset, the Q terminal output thus comes to have a low level and the QB terminal output comes to have a high level.

A technique is known (for example, see Patent Reference 1) in which an oscillation circuit is formed by using an amplifier generating charging and discharging currents of a capacitor according to rise and fall of first and second input signals; two comparators comparing a terminal voltage Va of the capacitor with an upper limit voltage Vth1 and a lower limit voltage Vth2, respectively; a flip-flop that is reset and set by the respective output signals of the two comparators; and a switch supplying a driving current to one of the two comparators according to a control signal.

PRIOR ART TECHNICAL REFERENCE

Patent Reference

Patent Reference 1: Japanese Laid-Open Patent Application No. 2009-159344

SUMMARY OF INVENTION

Problem to be Solved by the Invention

However, when the circuit of comparing plural input voltages with the same reference voltage is to be achieved by the conventional differential circuits, plural differential circuits such as the comparators 102 and 103 of FIG. 1 must be provided. Thus, the same number of reference voltage input parts (in the case of FIG. 1, the inverting input terminal parts of the comparators 102 and 103) exist, and thus, the circuit becomes larger in size.

An object of the present invention is to provide a differential circuit by which it is possible to easily reduce the area of the circuit that compares plural input voltages with the same reference voltage.

Means for Solving the Problem

In order to achieve the object, a differential circuit according to the present invention includes:
a first input part to which a first input voltage is input;
a second input part to which a second input voltage is input;

a reference voltage input part to which a reference voltage is input, the reference voltage input part being common to form differential pairs by pairing with respective ones of the first input part and the second input part;

a current source that drives the differential pairs;

a current mirror that generates a first output current and a second output current according to a current that flows through the reference voltage input part according to at least one of a first voltage difference between the first input voltage and the reference voltage and a second voltage difference between the second input voltage and the reference voltage;

a first output part that outputs a signal according to the first voltage difference, according to a current that flows through the first input part according to the first voltage difference and the first output current; and a second output part that outputs a signal according to the second voltage difference, according to a current that flows through the second input part according to the second voltage difference and the second output current.

Advantageous Effect of the Invention

According to the present invention, it is possible to easily reduce the area of the circuit that compares plural input voltages with the same reference voltage.

MODES FOR CARRYING OUT THE INVENTION

Below, referring to drawings, modes for carrying out the invention will be described. It is noted that in the respective drawings, each transistor in which a circle is given to the gate denotes a P-channel-type MOS transistor; and each transistor in which no circle is given to the gate denotes an N-channel-type MOS transistor.

<Configuration Diagram of Oscillation Circuit of First Embodiment of Differential Circuit of Present Invention>

Figure 3:
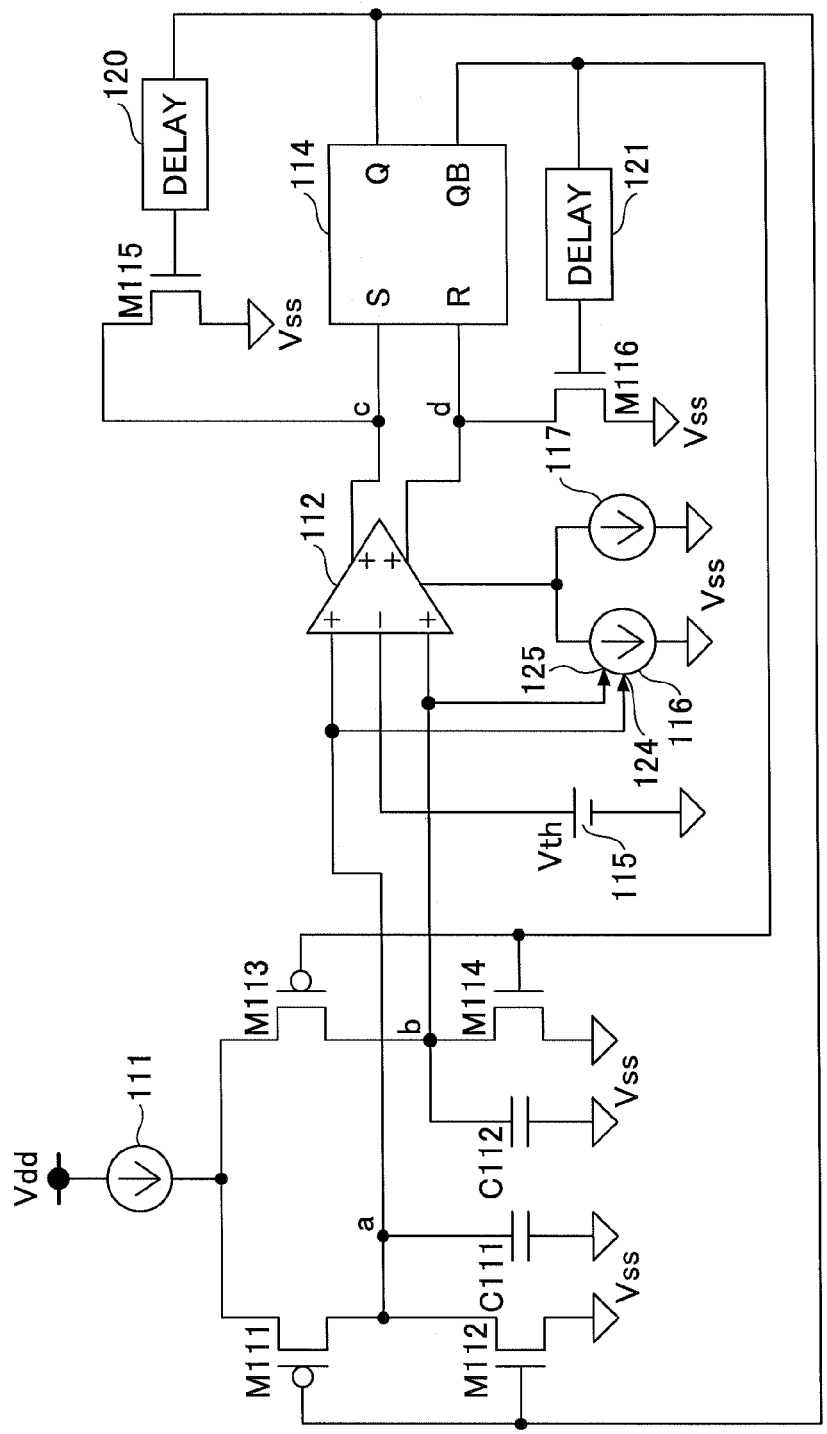
FIG. 3 is a configuration diagram of an oscillation circuit using a differential circuit according to the present invention as a comparator 112.

FIG. 3 is a configuration diagram of an oscillation circuit using a differential circuit of the present invention as a comparator 112. This oscillation circuit is formed as a semiconductor integrated circuit.

The oscillation circuit of FIG. 3 is characterized by having:

a charging and discharging part that switches charging and discharging of a capacitor according to a control signal;

a comparator that compares the voltage of the capacitor with a reference voltage and outputs a comparison result signal;

a flip-flop that is set or reset by the comparison result signal and provides an output signal as the control signal to be supplied to the changing and discharging part and also outputs the output signal as an oscillation signal; and a current control part that controls an operating current of the comparator according to the voltage of the capacitor.

It is preferable that the current control part has:

a first current control part that causes a current according to the voltage of the capacitor to flow through the comparator when the voltage of the capacitor approximates the reference voltage of the comparator; and a second current control part that causes a constant operating current to steadily flow through the comparator.

Further, it is preferable to provide a level changing part that changes the comparison result signal of the comparator to have a predetermined level according to a signal obtained from delaying the output signal of the flip-flop.

Below, a description will be made specifically.

In FIG. 3, one end of a constant current circuit 111 is connected to a power source Vdd and the other end thereof is connected to the sources of p-channel MOS transistors M111 and M113. The drain of the MOS transistor M111 is connected to the drain of an n-channel MOS transistor M112 and the source of the MOS transistor M112 is connected to a power source Vss. Further, the drain of the MOS transistor M113 is connected to the drain of an re-channel MOS transistor M114, and the source of the MOS transistor M114 is connected to the power source Vss.

The drains of the MOS transistors M111 and M112 are connected to one end of a capacitor C111 and also are connected to a first non-inverting terminal of a comparator 112 and a control terminal 124 of a current circuit 116. The other end of the capacitor C111 is connected to the power source Vss. The gates of the MOS transistors M111 and M112 are connected to the Q terminal of a RS flip-flop 114. Further, the drains of the MOS transistors M113 and M114 are connected to one end of a capacitor C112 and also are connected to a second non-inverting terminal of the comparator 112 and a control terminal 125 of the current circuit 116. The other end of the capacitor C112 is connected to the power source Vss. The gates of the MOS transistors M113 and M114 are connected to the QB terminal of the RS flip-flop 114.

The inverting terminal of the comparator 112 is connected to one end of a constant-voltage circuit 115, a reference voltage Vth is thus applied to the inverting terminal of the comparator 112, and the other end of the constant-voltage circuit 115 is connected to the power source Vss. The current input terminal of the comparator 112 is connected to one ends of the current circuits 116 and 117, an operating current is thus supplied thereby to the comparator 112, and the other ends of the current circuits 116 and 117 are connected to the power source Vss. The voltage of the capacitor C111 is supplied to the current circuit 116 at the control terminal 124, and this voltage causes the operating current to flow through the comparator 112 according to the voltage of the capacitor C111 when this voltage approximates the reference voltage Vth. Further, the voltage of the capacitor C112 is supplied to the current circuit 116 at the control terminal 125, and this voltage causes the operating current according to the voltage of the capacitor C112 to flow through the comparator 112 when this voltage approximates the reference voltage Vth.

The current circuit 117 causes a constant operating current to steadily flow through the comparator 112. It is noted that the operating current I2 that the current circuit 117 causes to flow through the comparator 112 has a small value of such a degree that an internal state of the comparator 112 can be maintained. The maximum operating current I1 that the current circuit 116 causes to flow together with the current circuit 117 at the reference voltage Vth to the comparator 112 has a value that is large to a certain extent required to change the internal state of the comparator 112.

The comparator 112 generates a first output signal that has a high level when the voltage of the capacitor C111 has exceeded the reference voltage Vth and has a low level when the voltage of the capacitor C111 is less than or equal to the reference voltage Vth, and supplies the first output signal to the set terminal S of the flip-flop 114 from a first output terminal. Further, the comparator 112 generates a second output signal that has a high level when the voltage of the capacitor C112 has exceeded the reference voltage Vth and has a low level when the voltage of the capacitor C112 is less than or equal to the reference voltage Vth, and supplies the second output signal to the reset terminal R of the flip-flop 114 from a second output terminal.

When a signal of a high level has been supplied at the set terminal S, the flip-flop 114 has a high level of the Q terminal output and has a low level of the QB terminal output. When a signal of a high level has been supplied at the reset terminal R, the flip-flop 114 has a low level of the Q terminal output and has a high level of the QB terminal output. One or both of the Q terminal output and the QB terminal output of the flip-flop 114 is (are) output as an oscillation output.

Further, the Q terminal of the flip-flop 114 is connected to the gate of an n-channel MOS transistor M115 via a delay circuit 120, the drain of the MOS transistor M115 is connected to the set terminal S of the flip-flop 114, and the source of the MOS transistor M115 is connected to the power source Vss. Thus, when a delay time of the delay circuit 120 has elapsed after the Q terminal output of the flip-flop 114 comes to have a high level, the MOS transistor M115 is turned on, and the set terminal S of the flip-flop 114 is forcibly changed into a low level.

Similarly, the QB terminal of the flip-flop 114 is connected to the gate of an n-channel MOS transistor M116 via a delay circuit 121, the drain of the MOS transistor M116 is connected to the reset terminal R of the flip-flop 114, and the source of the MOS transistor M116 is connected to the power source Vss. Thus, when a delay time of the delay circuit 121 has elapsed after the QB terminal output of the flip-flop 114 comes to have a high level, the MOS transistor M116 is turned on, and the reset terminal R of the flip-flop 114 is forcibly changed into a low level.

Thus, by providing the delay circuits 120 and 121 and the MOS transistors M115 and M116, it is possible to prevent the set terminal S and the reset terminal R of the flip-flop 114 from having high levels simultaneously even in a case where the oscillation frequency has been set to be a large value.

Figure 4A:
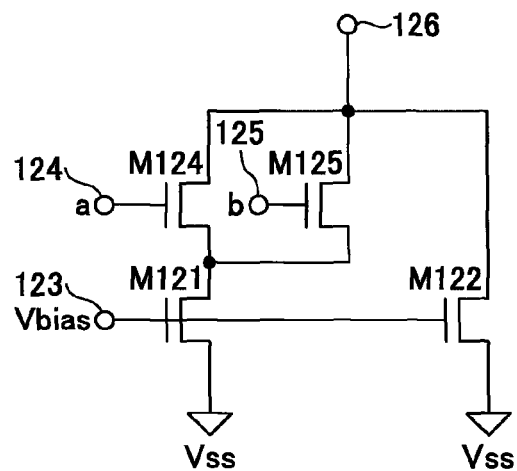
FIG. 4A is a circuit diagram of one embodiment of current circuits 116 and 117.
Figure 4B:
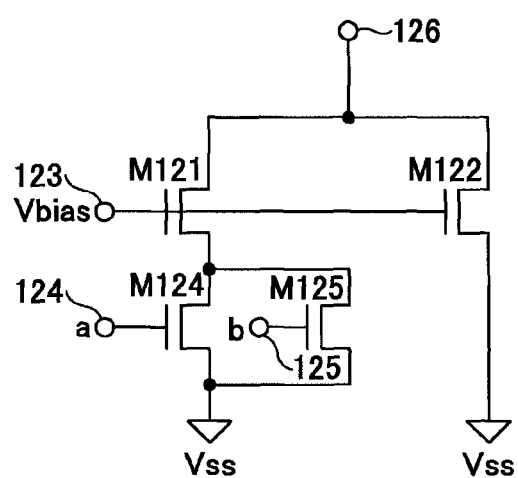
FIG. 4B is a circuit diagram of one embodiment of the current circuits 116 and 117.

FIGS. 4A and 4B show circuit diagrams of one embodiment of the current circuits 116 and 117. In FIG. 4A, a terminal 126 is connected to the current input terminal of the comparator 112. To the terminal 126, the drains of n-channel MOS transistors M124, M125 and M122 are connected. The sources of the MOS transistors M124 and M125 are connected to the drain of an n-channel MOS transistor M121. The sources of the MOS transistors M121 and M122 are connected to the power source Vss. The gate of the MOS transistor M124 is connected to the drains of the MOS transistors M111 and M112 via the control terminal 124 (see FIG. 3), and the gate of the MOS transistor M125 is connected to the drains of the MOS transistors M113 and M114 via the control terminal 125 (see FIG. 3). A bias voltage Vbias is supplied to the gates of the MOS transistors M121 and M122 from the terminal M123. The bias voltage Vbias is, for example, a constant voltage generated from being reduced from the power source Vdd. The MOS transistor M124 causes a current to flow according to a voltage applied to the gate from the control terminal 124, and the MOS transistor M125 causes a current to flow according to a voltage applied to the gate from the control terminal 125.

It is noted that in FIG. 4B, instead of the MOS transistors M124 and M125 being connected between the terminal 126 and the MOS transistor M121, the MOS transistors M124 and M125 are connected between the MOS transistor M121 and the power source Vss. Further, it is also possible to remove the MOS transistors M121 in FIGS. 4A and 4B.

Further, in FIGS. 4A and 4B, the current circuits 116 and 117 employ the n-channel MOS transistors. However, the current circuits 116 and 117 may employ p-channel MOS transistors in the same way.

It is noted that the threshold voltages of the n-channel MOS transistors M124, M125, M121 and M122 are, for example, on the order of 0.6 V. In order to cause the MOS transistors M124 and M125 to carry out desired switching operations, the reference voltage Vth is set to be, for example, approximately on the order of 1.0 V, higher than or equal to the threshold voltages of the MOS transistors M124 and M125. Further, in order to cause the MOS transistors M121 and M122 to carry out desired switching operations, the bias voltage Vbias is set to be, for example, approximately on the order of 0.8 V, higher than or equal to the threshold voltages of the MOS transistors M124 and M125 and lower than or equal to the reference voltage Vth. Further, in a case where the oscillation signal generated by this oscillation circuit is used as a clock of a delta sigma modulator of a continuous time system, it is required that the jitter of the clock is low. In such a case, the reference voltage Vth is set to be relatively high, thus the SN ratio is increased and the jitter is decreased. On the other hand, in a case where the oscillation circuit is used for the purpose of reduced current consumption, the reference voltage Vth is set as low as possible and the current consumption is reduced.

Figure 5:
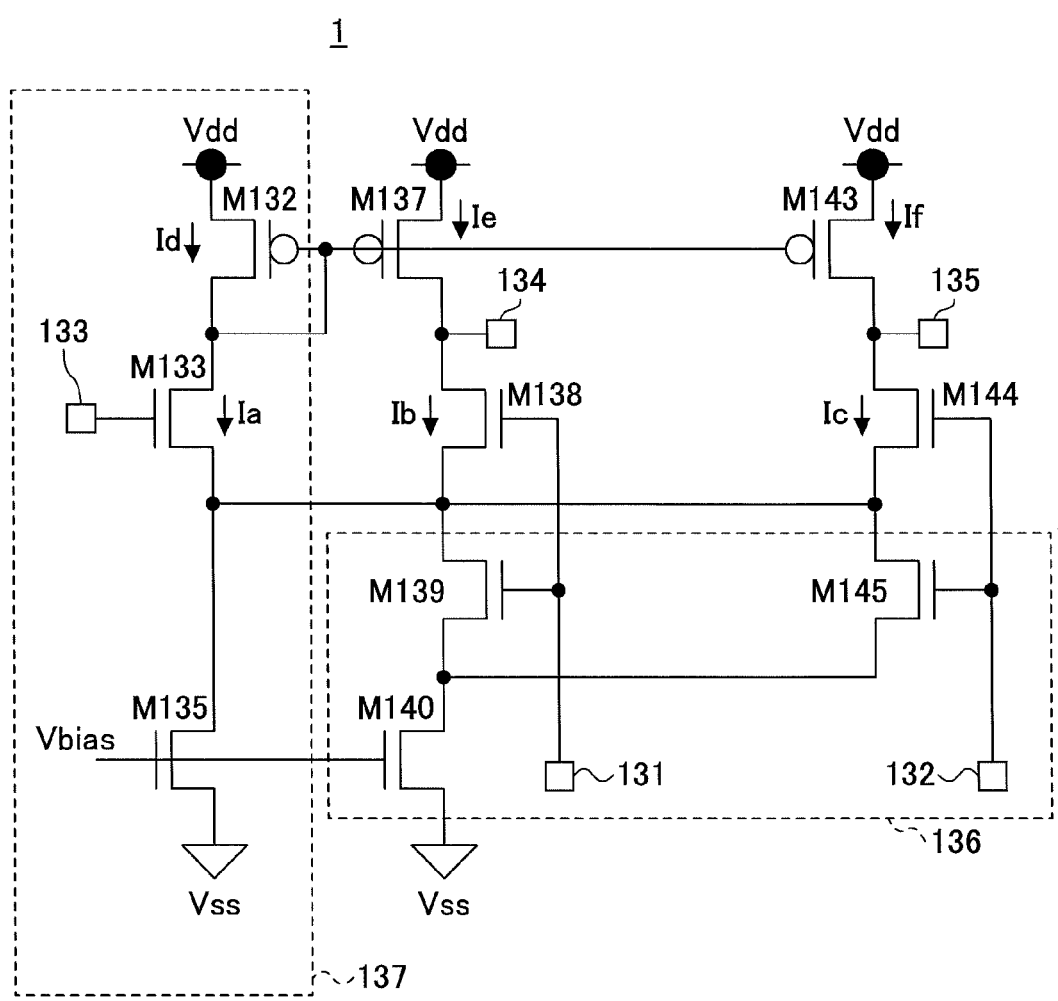
FIG. 5 is a configuration diagram of a differential circuit 1 that is one example of a differential circuit usable as the comparator 112.

FIG. 5 is a configuration diagram of a differential circuit 1 that is one example of a differential circuit usable as the comparator 112. The differential circuit 1 includes a MOS transistor M138 as a first input part to which a first input voltage is input. The first input voltage that is input from a first input terminal 131 is applied to the gate of the MOS transistor M138. The differential circuit 1 further includes a MOS transistor M144 as a second input part to which a second input voltage is input. The second input voltage that is input from a second input terminal 132 is applied to the gate of the MOS transistor M144. In a case where the differential circuit 1 is used as the comparator 112, the first input terminal 131 corresponds to the first non-inverting terminal of the comparator 112, and the first input voltage that is input from the first input terminal 131 corresponds to the voltage a of the capacitor C111. Similarly, the second input terminal 132 corresponds to the second non-inverting terminal of the comparator 112, and the second input voltage that is input from the second input terminal 132 corresponds to the voltage b of the capacitor C112.

Further, the differential circuit 1 includes a MOS transistor M133 as a reference voltage input part to which a reference voltage is input. The reference voltage that is input from a third input terminal 133 is applied to the gate of the MOS transistor M133. Respective differential pairs are formed as a result of the MOS transistor M133 pairing with the respective ones of the MOS transistors M138 and M144, and the MOS transistor M133 acts as the reference voltage input part to which the common reference voltage is input which is compared with the above-mentioned respective first input voltage and second input voltage. That is, the MOS transistor M133 acts as the reference voltage input part that is used in common in the first differential pair formed by the MOS transistors M133 and M138 and the second differential pair formed by the MOS transistors M133 and M144. The respective sources of the MOS transistors M133, M138 and M144 are connected together. In a case where the differential circuit 1 is used as the comparator 112, the third input terminal 133 corresponds to the inverting input terminal of the comparator 112, and the reference voltage that is input from the third input terminal 133 corresponds to the reference voltage Vth supplied from the constant-voltage circuit 115.

Further, the differential circuit 1 includes a MOS transistor M135 as a driving source driving the first differential pair and the second differential pair. The drain of the MOS transistor M135 is connected to the sources of the MOS transistors M133, M138 and M144. The source of the MOS transistor M135 is connected to the power source Vss. To the gate of the MOS transistor M135, a constant bias voltage Vbias is applied. In a case where the differential circuit 1 is used in the oscillation circuit of FIG. 3, the MOS transistor M135 corresponds to the MOS transistor M122 of the current circuit 117 (see FIGS. 4A and 4B), and the node at which the respective sources of the MOS transistors M133, M138 and M144 are connected together corresponds to the terminal 126 (see FIGS. 4A and 4B).

Further, the driving source driving the first differential pair and the second differential pair may include a MOS transistor M140 together with the MOS transistor M135. FIG. 5 shows a current varying part 136 formed by MOS transistors M140, M139 and M145. In a case where the differential circuit 1 is used in the oscillation circuit of FIG. 3, the MOS transistor M140 corresponds to the MOS transistor M121, the MOS transistor M139 corresponds to the MOS transistor M124 and the MOS transistor M145 corresponds to the MOS transistor M125.

Further, the differential circuit 1 includes a current mirror circuit that generates a first output current Ie and a second output current If according to a current Ia flowing to the drain of the MOS transistor M133. This current mirror circuit is formed by MOS transistors M132, M137 and M143. The sources of the MOS transistors M132, M137 and M143 are connected to the power source Vdd. The drains of the MOS transistors M132, M137 and M143 are connected to the drains of the MOS transistors M133, M138 and M144, respectively. The current Ia is a current flowing to the drain of the MOS transistor M133. The first output current Ie is a current flowing from the drain of the MOS transistor M137. The second output current If is a current flowing from the drain of the MOS transistor M143.

The current value of the current Ia varies according to at least one voltage difference of a first voltage difference between the voltage applied to the gate of the MOS transistor M138 and the voltage applied to the gate of the MOS transistor M133 and a second voltage difference between the voltage applied to the gate of the MOS transistor M144 and the voltage applied to the gate of the MOS transistor M133. The current Ia comes to have a current value according to the second voltage difference when there is the second voltage difference although there is no first voltage difference. The current value of the current Ia comes to have a current value according to the first voltage difference when there is the first voltage difference although there is no second voltage difference. The current Ia comes to have a current value according to the first voltage difference and the second voltage difference when there are both the first voltage difference and the second voltage difference.

Further, the differential circuit 1 includes a first output terminal 134 that outputs a first output voltage, as a first output part that outputs a first output signal according to the first voltage difference, according to a current Ib and the first output current Ie. The current Ib flows to the drain of the MOS transistor M138 according to the first voltage difference. The first output terminal 134 is connected to a node to which the drain of the MOS transistor M138 and the drain of the MOS transistor M137 are connected.

Further, the differential circuit 1 includes a second output terminal 135 that outputs a second output voltage, as a second output part that outputs a second output signal according to the second voltage difference, according to a current Ic and the second output current If. The current Ic flows to the drain of the MOS transistor M144 according to the second voltage difference. The second output terminal 135 is connected to a node to which the drain of the MOS transistor M144 and the drain of the MOS transistor M143 are connected.

In the case where the differential circuit 1 is used as the comparator 112, the first output terminal 134 corresponds to the first output terminal of the comparator 112, and the second output terminal 135 corresponds to the second output terminal of the comparator 112.

Figure 1:
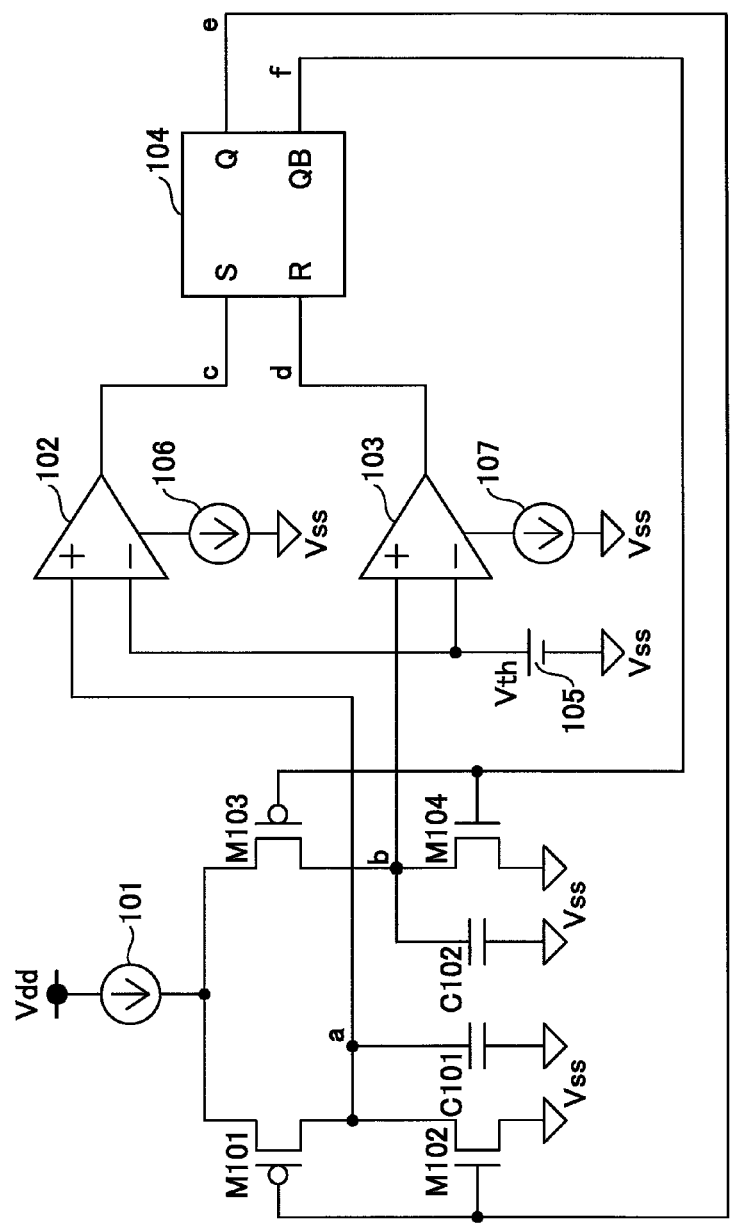
FIG. 1 is a circuit configuration diagram of one example of a conventional oscillation circuit.
Figure 2:
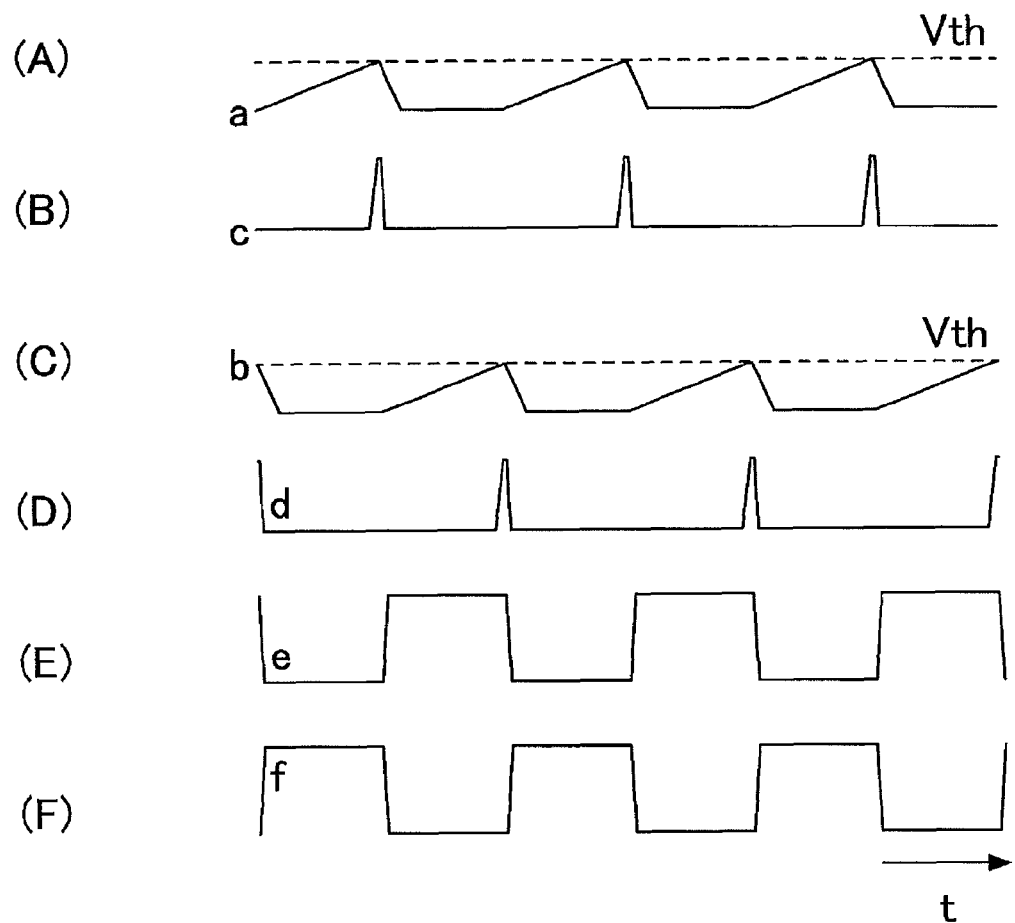
FIG. 2 is a signal waveform diagram of respective parts of the circuit of FIG. 1 (abscissa axis: time).

Thus, according to the configuration of the differential circuit 1 of FIG. 5, it is possible to integrate the inverting input terminal part of the comparator 102 and the inverting input terminal part of the comparator 103 of FIG. 1 into a single circuit sharing part 137. Thus, it is possible to integrate the two comparators of two-input and one-output into the single comparator of three-input and two-output, and thus, it is possible to easily reduce the area by reducing the devices to be used.

Figure 6:
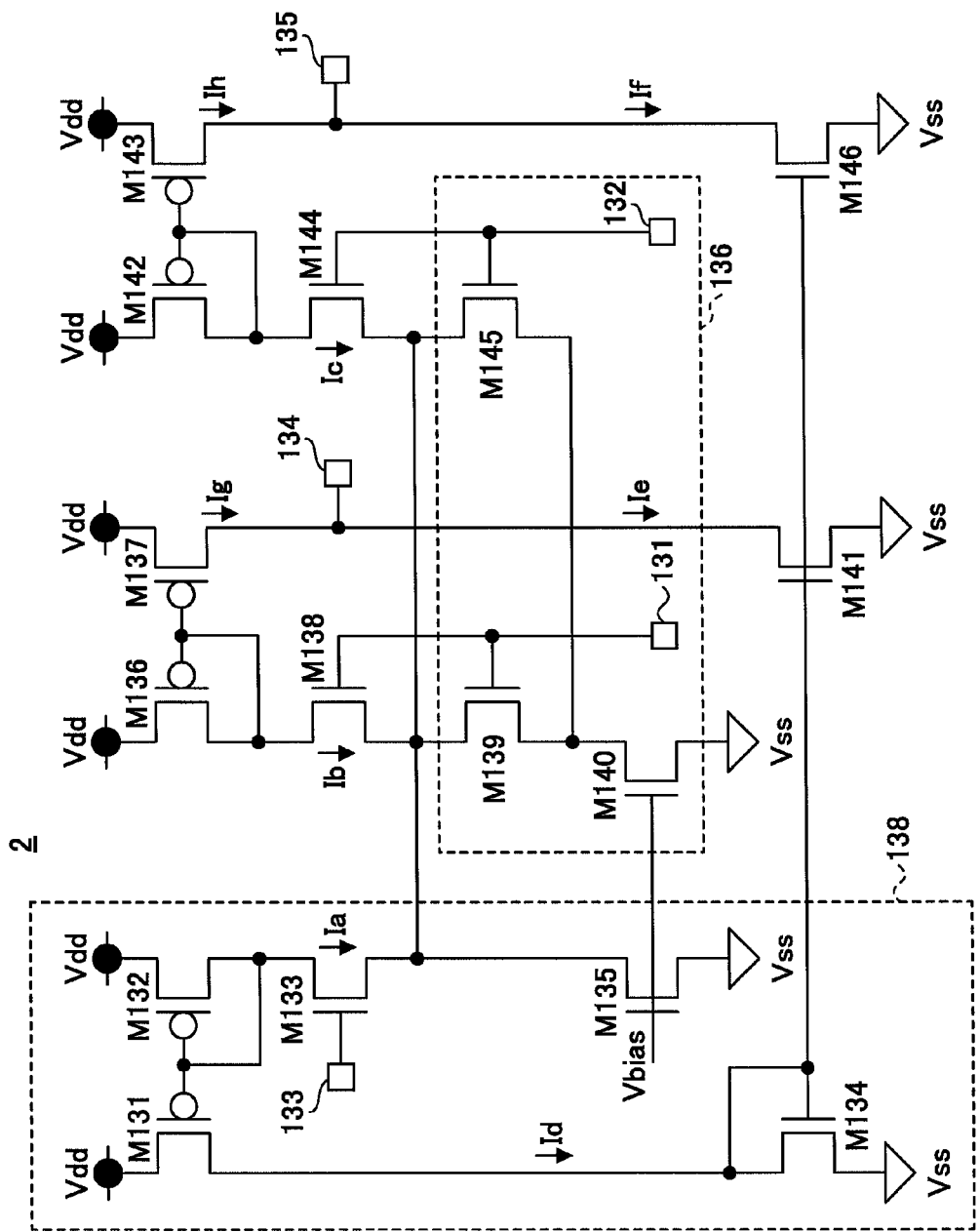
FIG. 6 is a configuration diagram of a differential circuit 2 that is one example of a differential circuit usable as the comparator 112.

FIG. 6 is a configuration diagram of a differential circuit 2 that is one example of a differential circuit usable as the comparator 112. For configurations the same as or similar to those of the differential circuit 1 of FIG. 5, description thereof will be omitted or simplified. Same as the differential circuit 1 of FIG. 5, a MOS transistor M138 is provided as a first input part, a MOS transistor M144 as a second input part, a MOS transistor M133 is provided as a reference voltage input part shared by two differential pairs, and a MOS transistor M135 is provided as a driving source of the two differential pairs.

The differential circuit 2 includes current mirror circuits that generate a first output current Ie and a second output current If according to a current Ia flowing to the drain of the MOS transistor M133. The current mirror circuits include a first current mirror circuit formed by MOS transistors M132 and M131, and a second current mirror circuit formed by MOS transistors M134, M141 and M146. The first current mirror circuit generates a current Id according to the current Ia in a predetermined current ratio. The second current mirror circuit generates the first output current Ie and the second output current If according to the current Id in predetermined current ratios. These current ratios may be 1:1. The current Id is a current flowing from the drain of the MOS transistor M131. The first output current Ie is a current flowing to the drain of the MOS transistor M141. The second output current If is a current flowing to the drain of the MOS transistor M146.

The sources of the MOS transistors M132 and M131 are connected to the power source Vdd. The drain of the MOS transistor M132 is connected to the drain of the MOS transistor M133. The drain of the MOS transistor M131 that is an output part of the first current mirror circuit is connected to the drain of the MOS transistor M134 that is an input part of the second current mirror circuit. The sources of the MOS transistors M134, M141 and M146 are connected to the power source Vss.

Further, the differential circuit 2 includes a third current mirror circuit formed by MOS transistors M136 and M137 as a first output part, and a first output terminal 134. The third current mirror circuit generates a current Ig flowing according to the current Ib. The current Ig flows from the drain of the MOS transistor M137, and is a current flowing according to the current Ib in a predetermined current ratio. The predetermined ratio may be 1:1. The first output terminal 134 is connected to a node to which the drain of the MOS transistor M137 and the drain of the MOS transistor M141 are connected.

Further, the differential circuit 2 includes a fourth current mirror circuit formed by MOS transistors M142 and M143 as a second output part, and a second output terminal 135. The fourth current mirror circuit generates a current Ih flowing according to the current Ic. The current Ih flows from the drain of the MOS transistor M143, and is a current flowing according to the current Ic in a predetermined current ratio. The predetermined ratio may be 1:1. The second output terminal 135 is connected to a node to which the drain of the MOS transistor M143 and the drain of the MOS transistor M146 are connected.

Thus, according to the configuration of the differential circuit 2 of FIG. 6, it is possible to integrate the inverting input terminal part of the comparator 102 and the inverting input terminal part of the comparator 103 of FIG. 1 into a single circuit sharing part 138. Thus, it is possible to integrate the two comparators of two-input and one-output into the single comparator of three-input and two-output, and thus, it is possible to easily reduce the area by reducing the devices to be used. Further, in the differential circuit 2, the MOS transistors M138 and M144 that form one circuits of the differential pairs are not included in the output stage. Thus, it is possible that the amplitudes of the voltages that are output from the output terminals 134 and 135 are (Vss-Vdd). Thus, it is possible to make the amplitudes larger than those of the differential circuit 1.

<Operations of Oscillation Circuit of FIG. 3>

Figure 7:
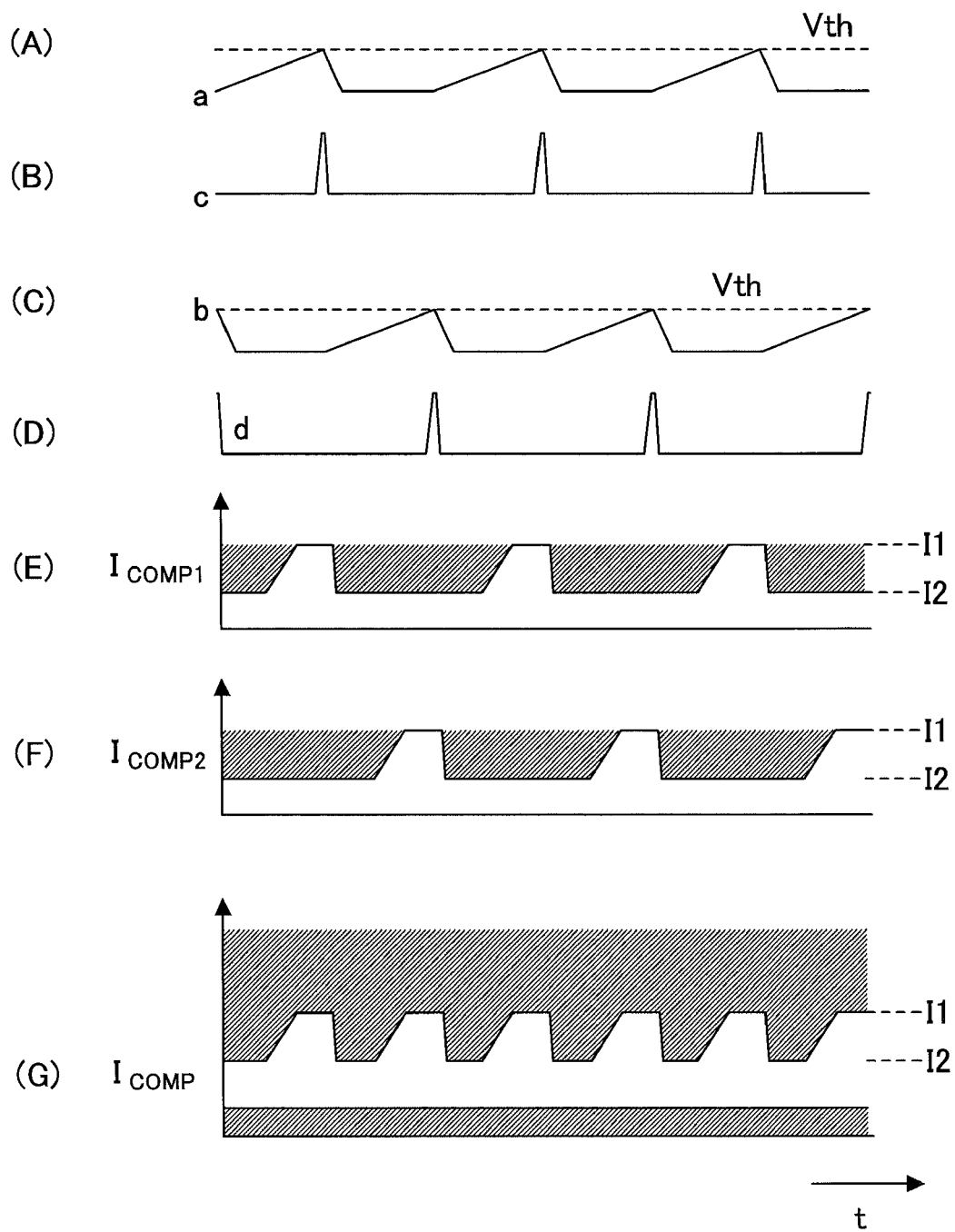
FIG. 7 is a signal waveform diagram of respective parts of the circuit of FIG. 3.

When the Q terminal output of the flip-flop 114 has a low level, the MOS transistor M111 is turned on, the MOS transistor M112 is turned off and thus, the capacitor C111 is charged (FIG. 7 (A)). Simultaneously, the QB terminal output has a high level, the MOS transistor 113 is turned off, the MOS transistor M114 is turned on and thus, the capacitor C112 is discharged (FIG. 7 (C)). Then, when the voltage of the capacitor C111 has exceeded the reference voltage Vth, the output of the first output terminal of the comparator 112 comes to have a high level (FIG. 7 (B)), the flip-flop 114 is set, thus the Q terminal output comes to have a high level and the QB terminal output comes to have a low level.

At this time, the MOS transistor M111 is turned off, the MOS transistor M112 is turned on, and thus the capacitor C111 is discharged. Simultaneously, the QB terminal output has the low level, thus the MOS transistor M113 is turned on, the MOS transistor M114 is turned off, and thus, the capacitor C112 is charged. Then, when the voltage of the capacitor C112 has exceeded the reference voltage Vth, the output of the second output terminal of the comparator 112 comes to have a high level (FIG. 7 (D)), the flip-flop 114 is reset, the Q terminal output comes to have a low level and the QB terminal output comes to have a high level.

FIG. 7 (E), FIG. 7 (F) and FIG. 7 (G) show operating currents of the comparator 112. The current circuit 117 causes a current of a value I2 to flow steadily. The current circuit 116 causes a saw-tooth current having the maximum value of I1 to flow as a result of addition being made to the current I2 when the voltage a of the capacitor 111 or the voltage b of the capacitor 112 approximates the reference voltage Vth. Specifically, the current circuit 116 causes a current to flow when the voltage a of the capacitor C111 is greater than or equal to the threshold voltage of the MOS transistor M124, or when the voltage b of the capacitor C112 is greater than or equal to the threshold voltage of the MOS transistor M125. The comparator 112 requires the large current I1 when the output value is to be changed between the high level and low level. However, while the switching does not occur, it is possible to maintain the internal state as long as the small current I2 is caused to flow.

It is noted that the current of the value I1 is caused to flow steadily in each of the comparators 2 and 3 of FIG. 1 in the prior art. Thus, according to the embodiment, it is possible to reduce the current at the shaded parts of FIG. 7 (E) and FIG. 7 (F). Although the current reduction amount varies depending on the value of the current I2 and the periods of causing the current I1 to flow, it is possible to reduce it to be less than ½ of that of the prior art. Further, by integrating the devices into the circuit sharing part 137 or 138 or the like, it is possible to reduce the bias current. Thus, it is possible to reduce the current consumption in comparison to the prior art during the entire operating period of the comparator 112 (see FIG. 7 (G)). Thus, the total current flowing through the comparator 112 becomes such as that shown in FIG. 7 (G), and it is possible to remarkably reduce the current of the shaded parts in comparison to the prior art.

<Configuration Diagram of Differential Operational Amplifier Circuit of Second Embodiment of Differential Circuit of Present Invention>

Figure 8:
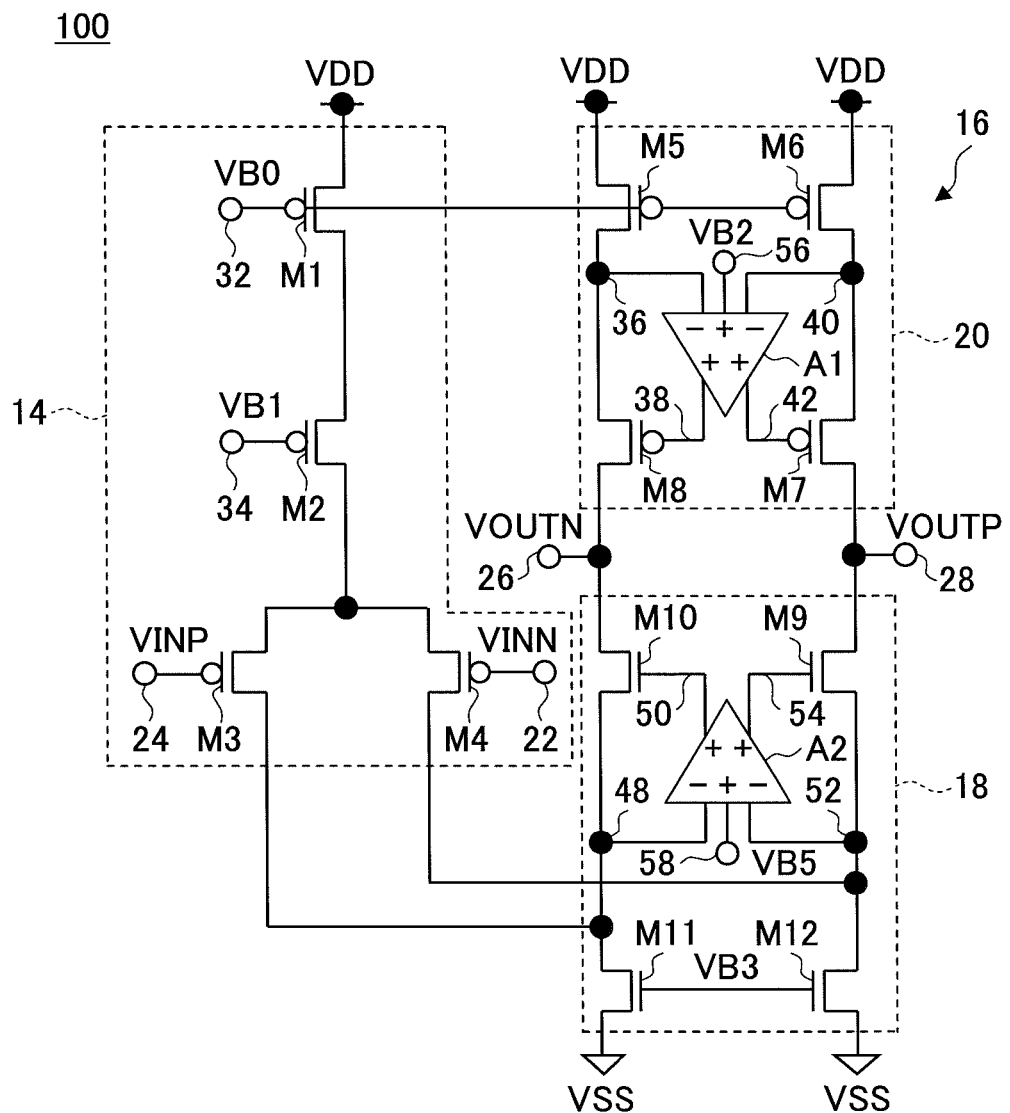
FIG. 8 is a configuration diagram of a differential operational amplifier 100 in which differential circuits according to the present invention are used as operational amplifiers A1 and A2.

FIG. 8 is a configuration diagram of a differential operational amplifier circuit 100 in which a differential circuit according to the present invention is used as operational amplifiers A1 and A2. The differential operational amplifier circuit 100 is an operational amplifier circuit of a folded type and a differential-input and differential-output type, and is integrated into a semiconductor integrated circuit including a CMOS process.

The differential operational amplifier circuit 100 is characterized by having:

a differential input circuit, plural cascode circuits, and an operational amplifier increasing the output impedances of the plural cascode circuits, wherein the operational amplifier includes:

differential pairs formed by plural input parts to which respective feedback voltages of the plural cascode circuits are input and a reference voltage input part to which a reference voltage common to the respective feedback voltages is input; and an output part that includes single end output parts outputting control voltages of the plural cascode circuits provided for the plural cascode circuits, respectively, and outputs, as the control voltages of the respective plural cascode circuits, results obtained from comparing the reference voltage with the respective feedback voltages by the differential pairs.

It is preferable that the above-mentioned second input part is used by the single end output parts in common.

Below, a specific description will be made.

The differential operational amplifier circuit 100 includes a P-channel-type differential input circuit 14 and a differential output circuit 16 connected to the differential input circuit 14.

The differential input circuit 14 includes a bias current source including transistors M1 and M2; and a differential input pair including a pair of transistors M3 and M4. The bias current source is connected to a terminal to which a positive-side power-supply voltage VDD is input, and supplies a bias current to the differential input pair including the transistors M3 and M4. The gate of the transistor M1 is connected to a terminal 32 to which a bias voltage VB0 is input, and the gate of the transistor M2 is connected to a terminal 34 to which a bias voltage VB1 is input. On the other hand, the differential input pair including the transistors M3 and M4 is connected to differential input terminals 22 and 24 of the differential operational amplifier circuit 100. The gate of the transistor M3 is connected to the differential input terminal 24 to which a positive input voltage VINP is input, and the gate of the transistor M4 is connected to the differential input terminal 22 to which a negative input voltage VINN is input. The drain of the transistor M3 is connected to a first inverting input terminal of an operational amplifier A2, and the drain of the transistor M4 is connected to a second inverting input terminal of the operational amplifier A2. The sources of the transistors M3 and M4 are connected together, and are connected to the bias current source including the transistors M1 and M2.

The differential output circuit 16 includes a P-channel-type PMOS cascode current source 20 connected between terminals to which the positive-side power-supply voltage VDD is input and a pair of differential output terminals 26 and 28 of the differential operational amplifier circuit 100; and an N-channel-type NMOS cascode current source 18 connected between terminals to which the negative-side power-supply voltage VSS is input and the pair of differential output terminals 26 and 28 of the differential operational amplifier circuit 100. Each of the PMOS cascode current source 20 and the NMOS cascode current source 18 includes plural cascode circuits formed by plural cascode devices connected in a cascode manner. The PMOS cascode current source 20 includes a first cascode circuit (M5, M8) including transistors M5 and M8; and a second cascode circuit (M6, M7) including transistors M6 and M7. The NMOS cascode current source 18 includes a third cascode circuit (M10, M11) including transistors M10 and M11; and a fourth cascode circuit (M9, M12) including transistors M9 and M12.

The first cascode circuit (M5, M8) is connected between the terminal to which the positive-side power-supply voltage VDD is input and the differential output terminal 26 of the differential operational amplifier circuit 100. The first cascode circuit (M5, M8) is, in the case of the shown configuration, a mirror circuit of the bias current source (M1, M2). That is, the gate of the transistor M5 is connected to the gate of the transistor M1, the source of the transistor M5 is connected to the positive-side power-supply voltage VDD, and the drain of the transistor M5 is connected to the source of the transistor M8. The configuration is not limited to that shown, and the bias between the transistor M1 and the transistor M5 may be separated. The gate of the transistor M8 corresponds to a control node 38 of the first cascode circuit (M5, M8), and a connection point between the transistors M5 and M8 corresponds to a feedback node 36 of the first cascode circuit (M5, M8). The control node 38 is connected to a first positive-side output terminal of the operational amplifier A1 included in the PMOS cascode current source 20, and the feedback node 36 is connected to a first inverting input terminal of the operational amplifier A1.

The second cascode circuit (M6, M7) is connected between the terminal to which the positive-side power-supply voltage VDD is input and the differential output terminal 28 of the differential operational amplifier circuit 100. The second cascode circuit (M6, M7) is, in the case of the shown configuration, a mirror circuit of the bias current source (M1, M2). That is, the gate of the transistor M6 is connected to the gate of the transistor M1, the source of the transistor M6 is connected to the positive-side power-supply voltage VDD, and the drain of the transistor M6 is connected to the source of the transistor M7. The configuration is not limited to that shown, and the bias between the transistor M1 and the transistor M6 may be separated. The gate of the transistor M7 corresponds to a control node 42 of the second cascode circuit (M6, M7), and a connection point between the transistors M6 and M7 corresponds to a feedback node 40 of the second cascode circuit (M6, M7). The control node 42 is connected to a second positive-side output terminal of the operational amplifier A1 included in the PMOS cascode current source 20, and the feedback node 40 is connected to a second inverting input terminal of the operational amplifier A1.

Further, a reference voltage VB2 is supplied to the non-inverting input terminal of the operational amplifier A1 via a terminal 56. The reference voltage VB2 is a bias voltage to be compared with voltages of both the feedback nodes 36 and 40.

The third cascode circuit (M10, M11) is connected between a terminal to which the negative-side power-supply voltage VSS is input and the differential output terminal 26 of the differential operational amplifier circuit 100. The drain of the transistor M11 is connected to the drain of the transistor M3 and the source of the transistor M10. A bias voltage VB3 is supplied between the gate and the source of the transistor M11 for causing a current to flow, which current is obtained from adding a current obtained from halving a constant current from the bias current source (M1, M2) by the differential input pair (M3, M4) and a constant current supplied by the first cascode circuit (M5, M8). The gate of the transistor M10 corresponds to a control node 50 of the third cascode circuit (M10, M11), and a connection point between the transistors M10 and M11 corresponds to a feedback node 48 of the third cascode circuit (M10, M11). The control node 50 is connected to a first positive-side output terminal of the operational amplifier A2 included in the NMOS cascode current source 18, and the feedback node 48 is connected to a first inverting input terminal of the operational amplifier A2.

The fourth cascode circuit (M9, M12) is connected between a terminal to which the negative-side power-supply voltage VSS is input and the differential output terminal 28 of the differential operational amplifier circuit 100. The drain of the transistor M12 is connected to the drain of the transistor M4 and the source of the transistor M9. The bias voltage VB3 is supplied between the gate and the source of the transistor M12 for causing a current to flow, which current is obtained from adding a current obtained from halving a constant current from the bias current source (M1, M2) by the differential input pair (M3, M4) and a constant current supplied by the second cascode circuit (M6, M7). The gate of the transistor M9 corresponds to a control node 54 of the fourth cascode circuit (M9, M12), and a connection point between the transistors M9 and M12 corresponds to a feedback node 52 of the fourth cascode circuit (M9, M12). The control node 54 is connected to a second positive-side output terminal of the operational amplifier A2 included in the NMOS cascode current source 18, and the feedback node 52 is connected to a second inverting input terminal of the operational amplifier A2.

Further, a reference voltage VB5 is supplied to the non-inverting input terminal of the operational amplifier A2 via a terminal 58. The reference voltage VB5 is a bias voltage to be compared with voltages of both the feedback nodes 48 and 52.

Figure 9:
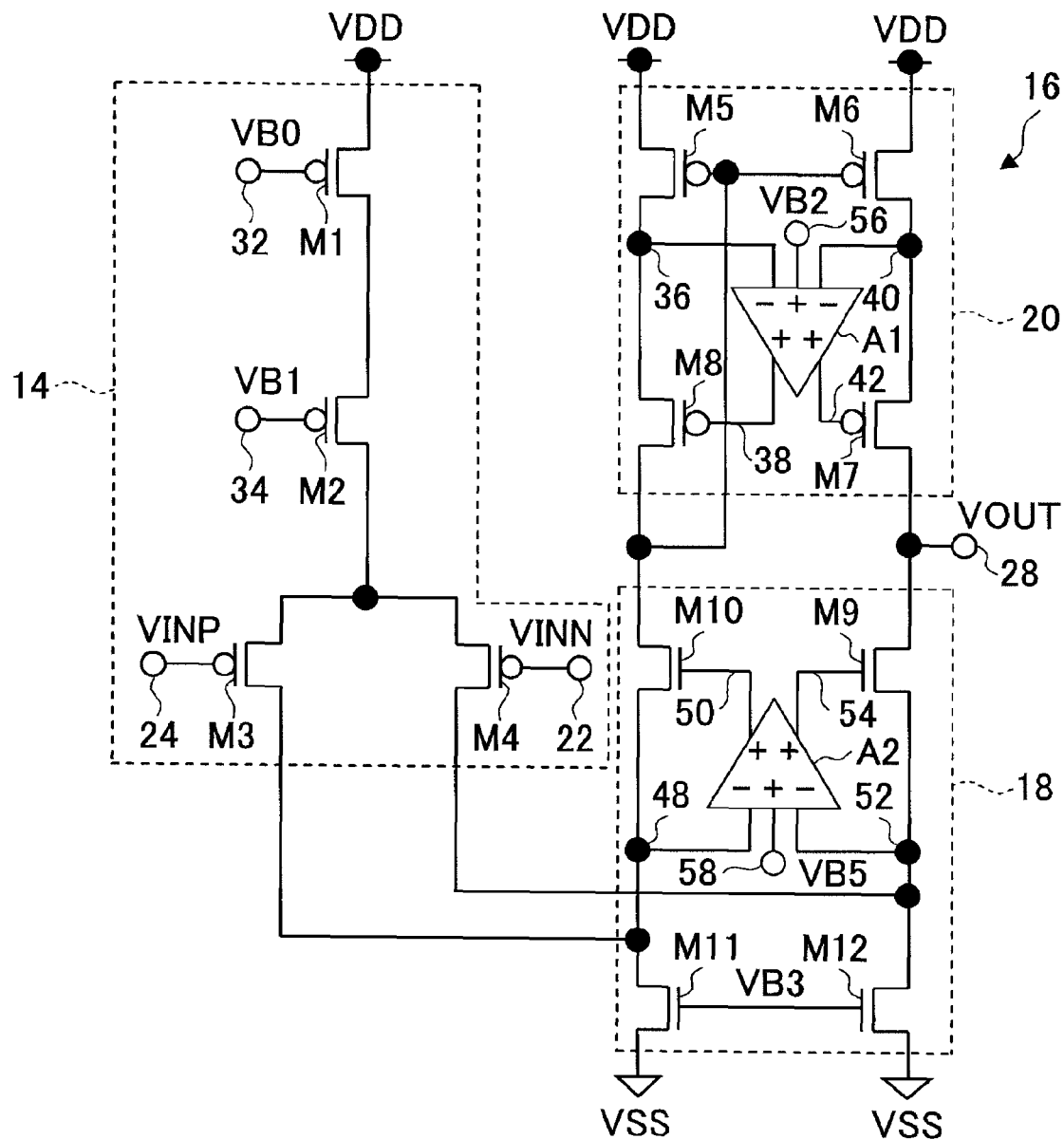
FIG. 9 is a configuration diagram of a differential operational amplifier 200 in which differential circuits according to the present invention are used as the operational amplifiers A1 and A2.

It is noted that the differential operational amplifier circuit is not limited to the mode shown in FIG. 8. FIG. 9 is a configuration diagram of a differential operational amplifier circuit 200 in which a differential circuit of the present invention is used as operational amplifiers A1 and A2. The differential operational amplifier circuit 200 is an operational amplifier circuit of a folded type and a differential-input and single-end-output type, and is integrated into a semiconductor integrated circuit including a CMOS process. In the configuration of FIG. 9, description will be omitted for configurations the same as or similar to configurations of FIG. 8.

In FIG. 9, a current mirror circuit is formed as a result of a connection point between transistors M8 and M10 being connected to the gate of a transistor M5. Thus, the gate of a transistor M1 is not connected with the gates of transistors M5 and M6.

Figure 10:
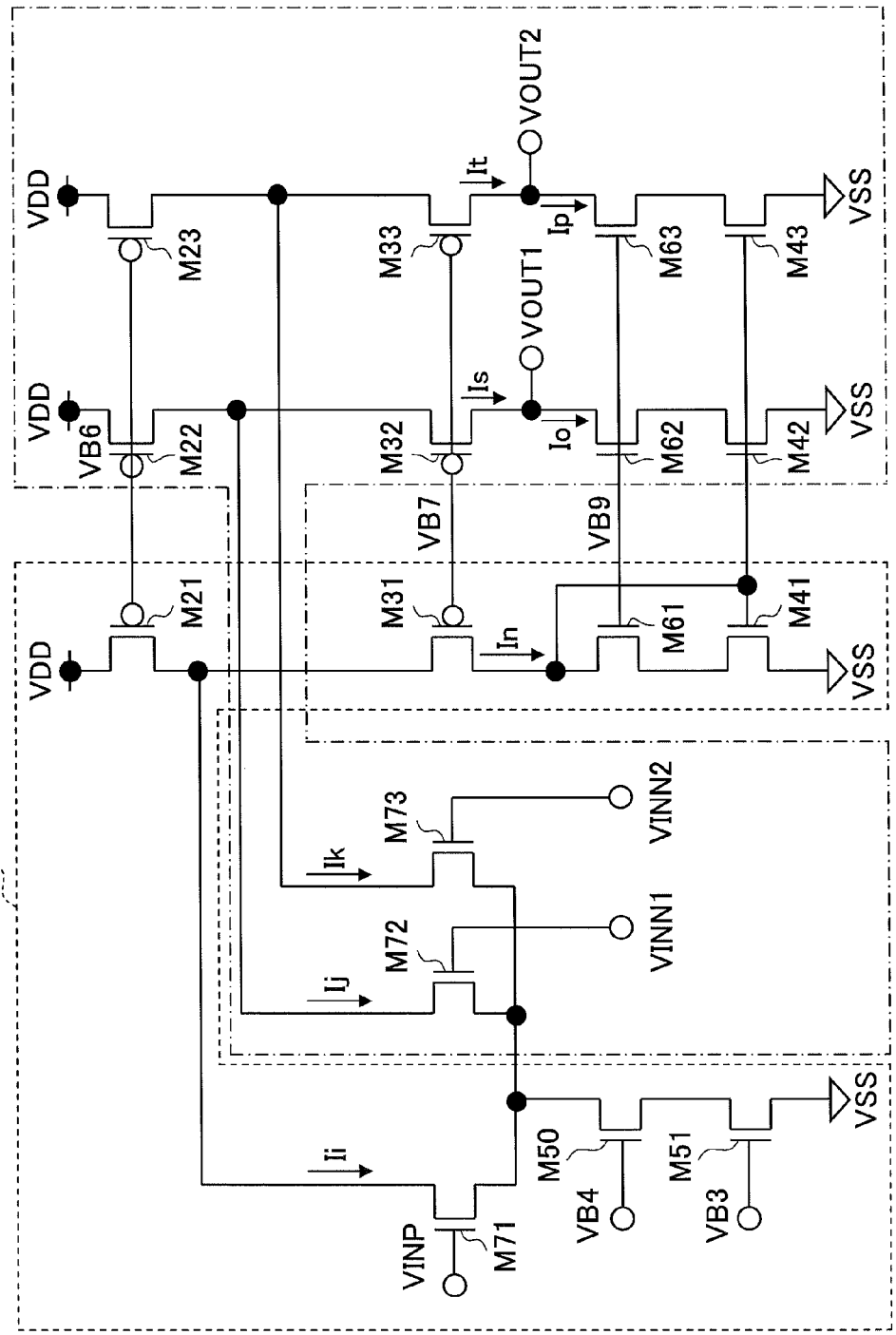
FIG. 10 is a configuration diagram of one example of a differential circuit usable as the operational amplifier A1.

FIG. 10 is a configuration diagram of one example of a differential circuit usable as the operational amplifier A1 shown in FIGS. 8 and 9. Correspondence relationship will now be described between FIGS. 8 and 9 and FIG. 10. A feedback voltage supplied to the first inverting input terminal of the operational amplifier A1 via the feedback node 36 from the first cascode circuit (M5, M8) corresponds to a first feedback input voltage VINN1 that is input to the gate of a transistor M72. A feedback voltage supplied to the second inverting input terminal of the operational amplifier A1 via the feedback node 40 from the second cascode circuit (M6, M7) corresponds to a second feedback input voltage VINN2 that is input to the gate of a transistor M73. A reference voltage VB2 supplied to the non-inverting input terminal of the operational amplifier A1 corresponds to a reference voltage VINP that is input to the gate of a transistor M71. A control voltage supplied to the control node 38 of the first cascode circuit (M5, M8) from the first positive-side output terminal of the operational amplifier A1 corresponds to a first control output voltage VOUT1 that is output from a connection point between transistors M32 and M62. A control voltage supplied to the control node 42 of the second cascode circuit (M6, M7) from the second positive-side output terminal of the operational amplifier A1 corresponds to a second control output voltage VOUT2 that is output from a connection point between transistors M33 and M63.

The operational amplifier A1 shown in FIG. 10 has N-channel-type NMOS differential pairs formed by a first input part to which the feedback input voltage VINN1 is input; a second input part to which the feedback input voltage VINN2 is input; and a reference voltage input part to which the referential input voltage VINP is input. The first input part is formed by the transistor M72, and the second input part is formed by the transistor M73. The reference voltage input part is formed by the transistor M71 and transistors M21, M31, M61 and M41. This NMOS differential pair is connected to a bias current source that is formed into a cascode type by transistors M50 and M51.

Further, the operational amplifier A1 includes a first single-end output part that outputs the first control output voltage VOUT1 that controls a current flowing through the first cascode circuit (M5, M8); and a second single-end output part that outputs the second control output voltage VOUT2 that controls a current flowing through the second cascode circuit (M6, M7).

The first single-end output part is formed by transistors M22, M32, M62 and M42. The first control output voltage VOUT1 that is output by the first single-end output part is a voltage obtained from amplifying a difference voltage between the reference voltage VINP and the first feedback input voltage VINN1 by a first low-voltage cascode-type NMOS current mirror formed by transistors M61, M62, M41 and M42. The first low-voltage cascode-type NMOS current mirror is connected to a first PMOS bias current source that is formed by transistors M21, M22, M31 and M32.

The second single-end output part is formed by transistors M23, M33, M63 and M43. The second control output voltage VOUT2 that is output by the second single-end output part is a voltage obtained from amplifying a difference voltage between the reference voltage VINP and the second feedback input voltage VINN2 by a second low-voltage cascode-type NMOS current mirror formed by transistors M61, M63, M41 and M43. The second low-voltage cascode-type NMOS current mirror is connected to a second PMOS bias current source that is formed by transistors M21, M23, M31 and M33.

The first low-voltage cascode-type NMOS current mirror generates a first output current Io according to a current In that changes according to a current Ii that flows to the drain of the transistor M71 of the reference voltage input part. The second low-voltage cascode-type NMOS current mirror generates a second output current Ip according to the current In that changes according to the current Ii that flows to the drain of the transistor M71 of the reference voltage input part.

The current value of the current Ii changes according to at least one voltage difference of a first voltage difference between the voltage that is input to the gate of the transistor M72 and the voltage that is input to the gate of the transistor M71 and a second voltage difference between the voltage that is input to the gate of the transistor M73 and the voltage that is input to the gate of the transistor M71. The current Ii has a current value according to the second voltage difference when there is the second voltage difference although there is no first voltage difference. The current Ii has a current value according to the first voltage difference when there is the first voltage difference although there is no second voltage difference. The current Ii has a current value according to both the voltage differences of the first voltage difference and the second voltage difference when there are both the first voltage difference and the second voltage difference.

The current In is a current flowing from the drain of the transistor M31 of the reference voltage input part. The first output current Io has the same current value as that of the current In, and is a current flowing to the drain of the transistor M62. The second output current Ip has the same current value as that of the current In, and is a current flowing to the drain of the transistor M63.

Further, the operational amplifier A1 outputs the first control output voltage VOUT1, according to a current Is and the first output current Io. The current Is has a current value that changes according to a current Ij that flows to the drain of the transistor M72. The current value of the current Ij changes according to the first voltage difference between the voltage that is input to the gate of the transistor M72 and the voltage that is input to the gate of the transistor M71. The current Is is a current that flows from the drain of the transistor M32.

Further, the operational amplifier A1 outputs the second control output voltage VOUT2, according to a current It and the second output current Ip. The current It has a current value that changes according to a current Ik that flows to the drain of the transistor M73. The current value of the current Ik changes according to the second voltage difference between the voltage that is input to the gate of the transistor M73 and the voltage that is input to the gate of the transistor M71. The current It is a current that flows from the drain of the transistor M33.

Thus, according to the configuration of the differential circuit of FIG. 10 used as the operational amplifier A1, it is possible to integrate respective reference voltage input terminal parts of two operational amplifiers of the prior art into a single circuit sharing part 139. Thus, it is possible to integrate the two two-input one-output operational amplifiers into the single three-input and two-output operational amplifier. Thus, it is possible to easily achieve reduction in an area by reducing the devices to be used.

Figure 11:
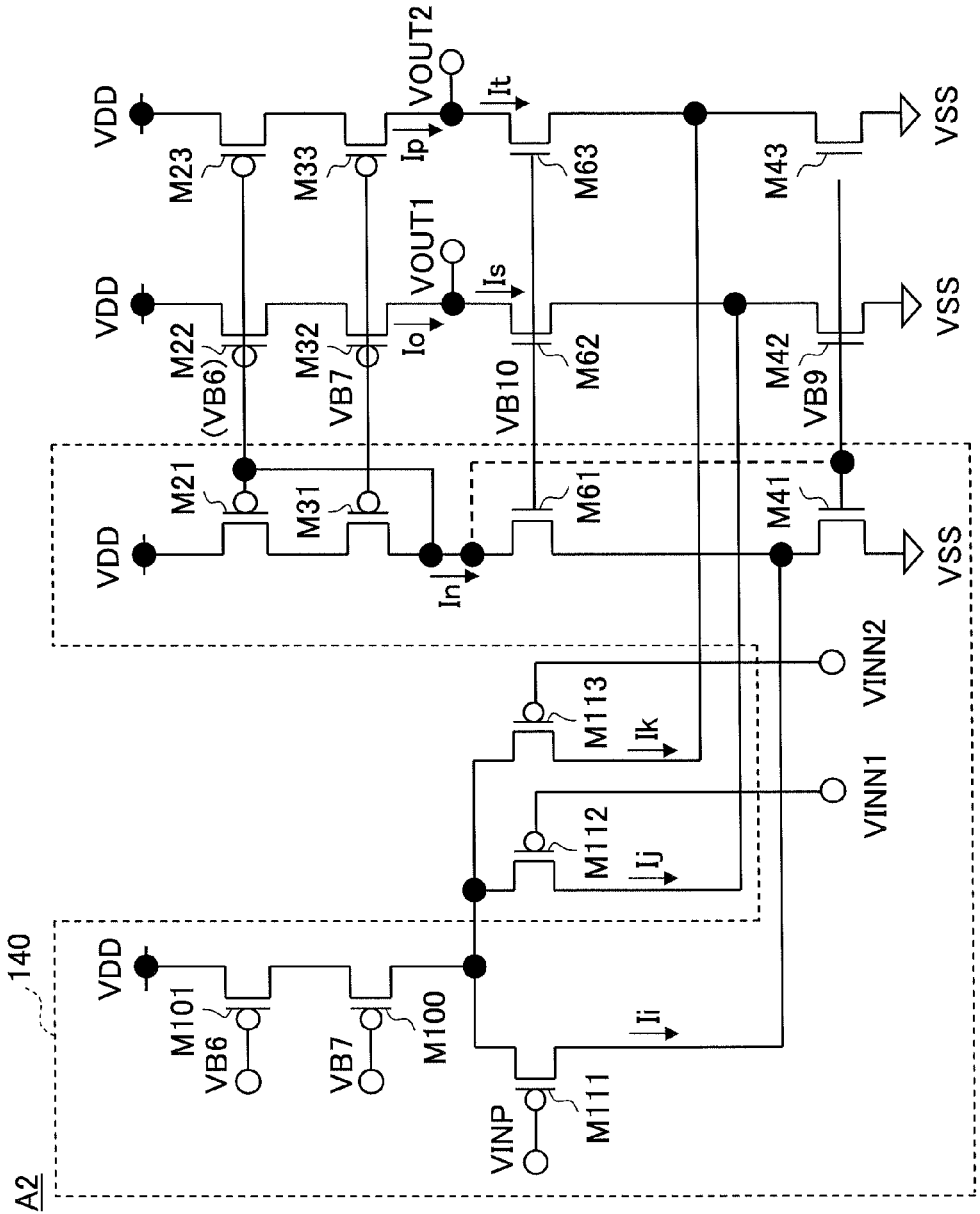
FIG. 11 is a configuration diagram of one example of a differential circuit usable as the operational amplifier A2.

FIG. 11 is a configuration diagram of one example of a differential circuit usable as the operational amplifier A2 shown in FIGS. 8 and 9. The configuration of FIG. 11 is obtained from inverting the configuration of FIG. 10, and thus, description of details will be omitted. That is, the differential pairs of the operational amplifier A1 of FIG. 10 are of the N-channel type since the cascode circuits connected to the differential pairs are of the P-channel type. However, the differential pairs of the operational amplifier A2 of FIG. 11 are of the P-channel type since the cascode circuits connected to the differential pairs are of the N-channel type. The same manner will be also applied to the single-end output parts.

Further, also by the configuration of the differential circuit of FIG. 11 used as the operational amplifier A2, same as the configuration of the differential circuit of FIG. 10, it is possible to integrate the respective reference voltage input terminal parts of the two operational amplifiers of the prior art into a single circuit sharing part 140. Thus, it is possible to easily achieve reduction in an area by reducing the devices to be used.

Figure 12:
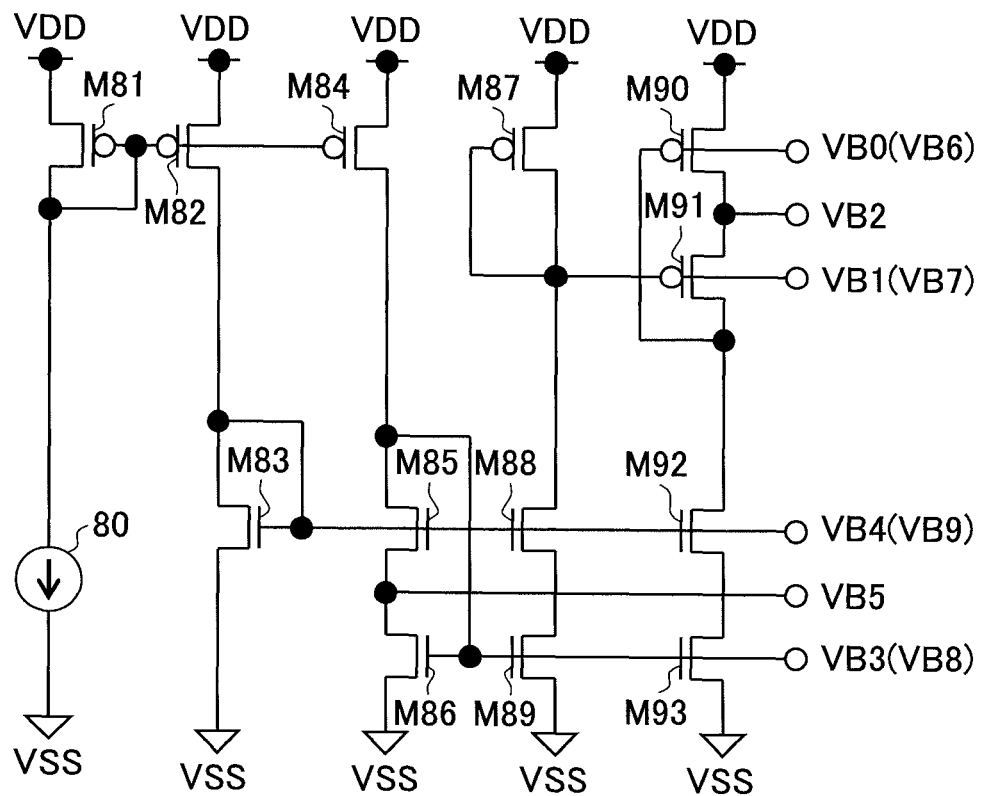
FIG. 12 is a configuration diagram of a bias circuit.

FIG. 12 is one example of a bias circuit generating the constant bias voltages VB* applied to the transistors M* and the operational amplifiers A1 and A2 shown in the respective drawings. The configuration of the bias circuit is not limited to this example. The bias circuit of FIG. 12 includes a former-stage current mirror part generating bias currents and a latter-stage current mirror part generating the respective bias voltages VB*. By configuring as shown, it is possible to generate the plural bias voltages VB* having the magnitude relationship of VB5<VB3(VB8)<VB4(VB9) and VB1(VB7)<VB0 (VB6)<VB2.

Thus, when applying the thus generated respective bias voltages VB* to the respective parts, both the voltages of the feedback nodes 36 and 40 are adjusted to be approximately equal to the common reference voltage VB2 by negative feedback of the operational amplifier A1 of FIGS. 8 and 9. As a result, it is possible to increase the output impedances of the first cascode circuit (M5, M8) and the second cascode circuit (M6, M7) by the gain of operational amplifier A1. It is same or similar for the operational amplifier A2.

Further, the operational amplifiers A1 and A2 have the configurations of operational amplifiers of differential-input and single-end-output type as shown in FIGS. 10 and 11, not a differential-output type. Thus, a common-mode feedback circuit that is required in the prior art becomes unnecessary. That is, in the case of the operational amplifier A1, feedback control is carried out in such a manner that the reference voltage VB2 and the voltages of the feedback nodes 36 and 40 become the same voltage. Thus, it is possible to maintain the control node 38 to have a stable voltage only by adjusting the input-side reference voltage VB2 without providing a new circuit at an output side of the operational amplifier A1. It is same or similar for the case of the operational amplifier A2.

Further, in the operational amplifiers A1 and A2, the reference voltage input part (M71, M21, M31, M61 and M41) to which the reference input voltage VINP is input is integrated into the single circuit shared by the first single-end output part and the second single-end output part. Thus, it is possible to reduce the circuit area and the consumed current in comparison to a configuration in which plural input parts to which a reference input voltage VINP is input exist for respective single-end output parts.

Further, when an operational amplifier circuit is operated by a low voltage, an operating voltage margin is reduced. Thus, a common mode feedback control of relatively high accuracy is required for a common mode feedback circuit to be used for a differential-output-type operational amplifier that increases the output impedances of cascode circuits, in order to prevent a reduction of the drain-source voltages of transistors M5, M6, M11 and M12 and prevent a reduction of the output impedances of the cascode circuits. In contrast thereto, in the case of the single-end-output operational amplifiers A1 and A2, the electric potentials of the feedback nodes 36, 40, 48 and 52 are determined with accuracy on the order of an offset error, and it is not necessary to provide an extra operating voltage margin for a time of operating at a low voltage. Thus, it is possible to operate the operational amplifier circuit by a further lower power-supply voltage.

Thus, the preferable embodiments have been described in detail. However, the present invention is not limited to the above-described embodiments, and it is possible to carry out various modifications and replacements on the above-described embodiments without departing from the scope of the present invention.

For example, in FIG. 11, such a configuration may be made that the gate of the transistor M21 and the drain of the transistor M31 are not connected, the bias voltage VB6 is applied to the gates of the transistors M21, M22 and M23, the gate of the transistor M41 and the drain of the transistor M61 (M31) are connected together, and the bias voltage VB9 is not applied.

Figure 13:
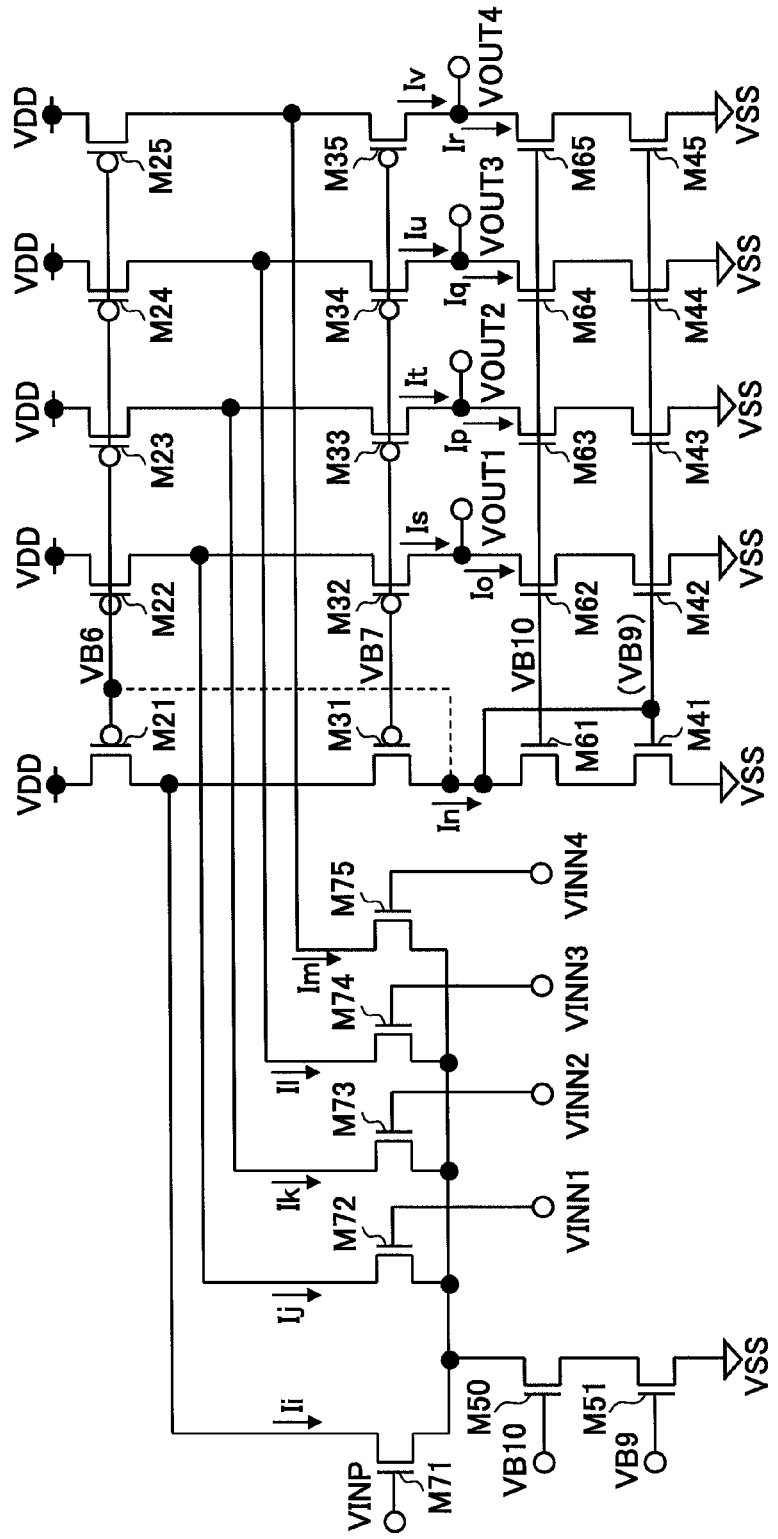
FIG. 13 is a configuration diagram of one example of a differential circuit usable as an operational amplifier A1-1.
Figure 14A:
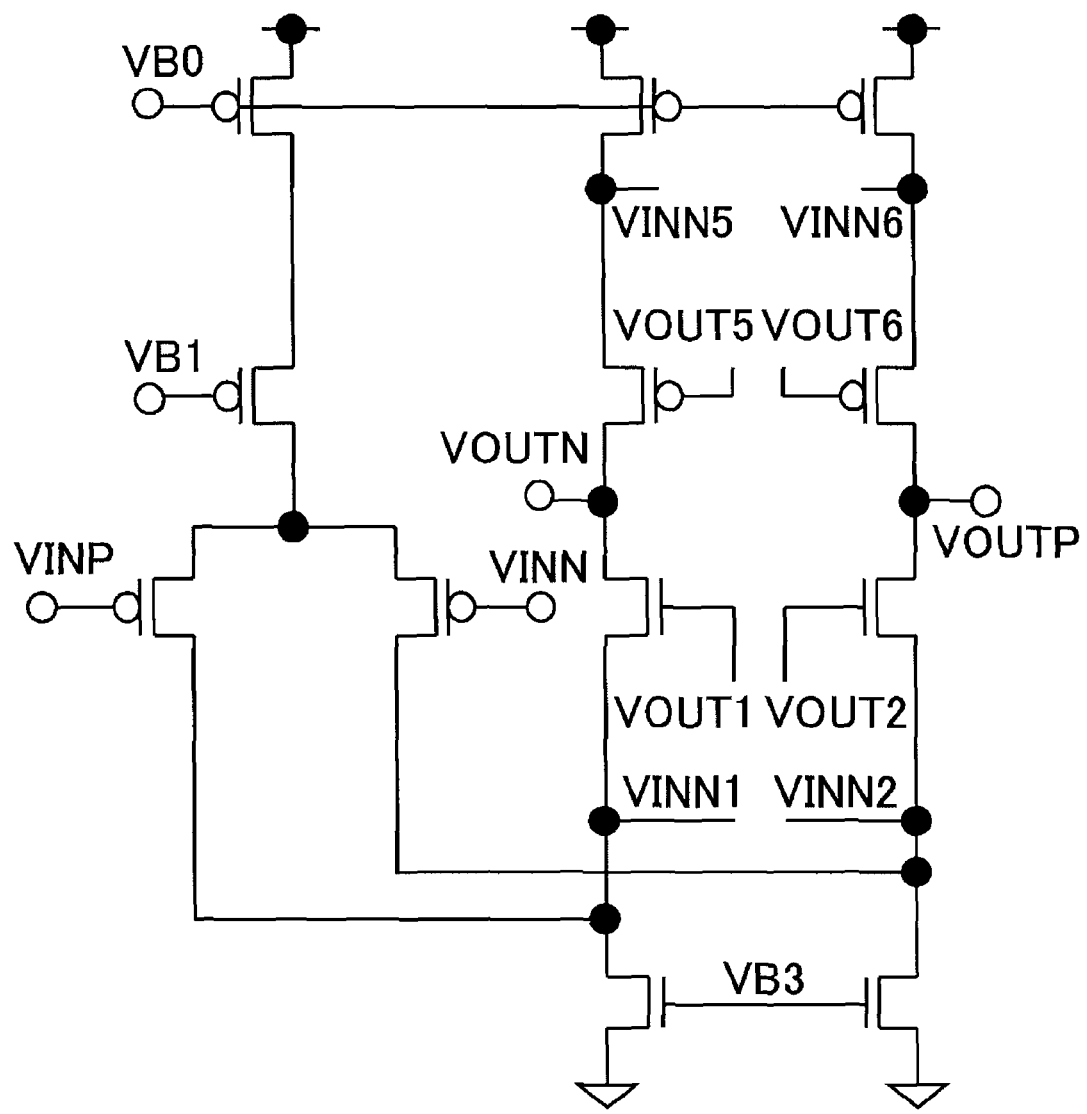
FIG. 14A is a configuration diagram in which operational amplifiers A1-1 (FIG. 14C) and A2-1 (FIG. 14D) according to the present invention are used in common in two operational amplifier circuits 100-1 (FIG. 14A) and 100-2 (FIG. 14B).
Figure 14B:
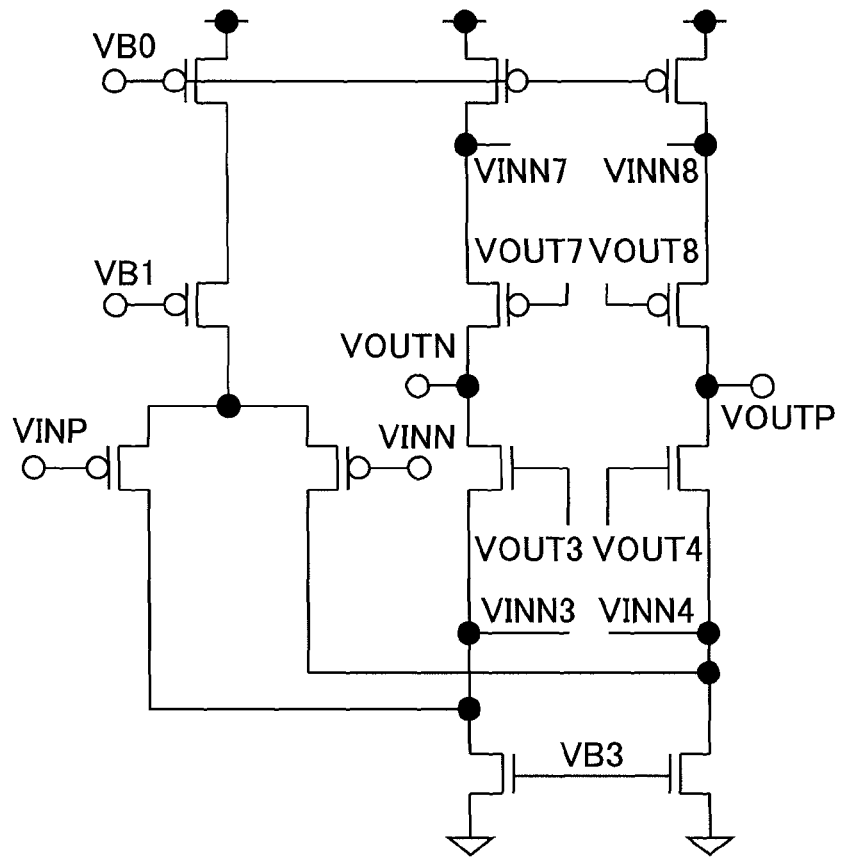
FIG. 14B is a configuration diagram in which the operational amplifiers A1-1 (FIG. 14C) and A2-1 (FIG. 14D) according to the present invention are used in common in the two operational amplifier circuits 100-1 (FIG. 14A) and 100-2 (FIG. 14B).
Figure 14C:
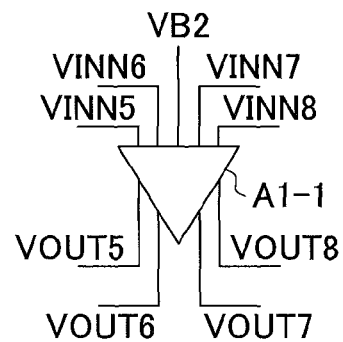
FIG. 14C is a configuration diagram in which the operational amplifiers A1-1 (FIG. 14C) and A2-1 (FIG. 14D) according to the present invention are used in common in the two operational amplifier circuits 100-1 (FIG. 14A) and 100-2 (FIG. 14B).
Figure 14D:
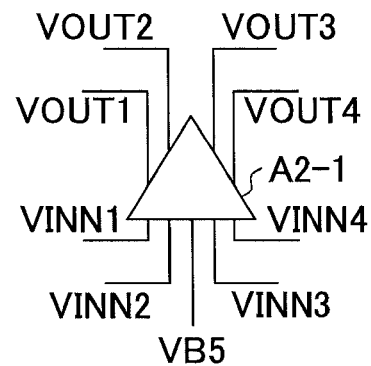
FIG. 14D is a configuration diagram in which the operational amplifiers A1-1 (FIG. 14C) and A2-1 (FIG. 14D) according to the present invention are used in common in the two operational amplifier circuits 100-1 (FIG. 14A) and 100-2 (FIG. 14B).

Further, the configuration of the operational amplifier is not limited to three-input and two-output as shown in FIGS. 10 and 11, and may be (N+1)-input and N-output (N being an integer greater than or equal to 2). FIG. 13 is a configuration diagram of one example of a differential circuit usable as a five-input and four-output operational amplifier A1-1. The operational amplifier A1-1 obtained from extending the configuration of the operational amplifier A1 of FIG. 10 outputs four control output voltages VOUT1 to VOUT4 based on currents Ii to Iv that flow according to four feedback input voltages VINN1 to VINN4 and a single reference voltage VINP. That is, in a case where there are three cascode circuits for which the impedances are to be increased, it is difficult to adapt thereto in the prior art. However, according to the present invention, it is easy to adapt thereto, since it is possible to increase or decrease the number of first input parts to which feedback voltages are input and the number of single-end output parts to be equal to the number of cascode circuits.

Further, in FIG. 13, such a configuration may be made that the gate of a transistor M41 and the drain of a transistor M61 are not connected and a bias voltage VB9 is applied to the gates of transistors M41 to M45, and also, the gate of a transistor M21 and the drain of a transistor M31 (M61) are connected and a bias voltage VB6 is not applied.

Further, in a case where differential pairs are of an N-channel type, some or all of cascode devices of N-channel-type MOS transistors may be omitted. In a case where differential pairs are of a P-channel type, some or all of cascode devices of P-channel-type MOS transistors may be omitted. For example, in FIG. 13, a bias voltage VB10 is applied to transistors M50 and M61 to 65. However, the bias voltage VB10 may be applied only to the transistor M50, and the transistors M61 to 65 may be omitted. Alternatively, the transistor 50 may be omitted, and the bias voltage VB10 may be applied only to the transistors M61 to 65. Further, the transistors M50 and M61 to 65 may be omitted.

Further, in a case where there are plural operational amplifier circuits to be gain-boosted, an operational amplifier(s) according to the present invention may be shared by the plural operational amplifier circuits. FIGS. 14A, 14B, 14C and 14D are a configuration diagram in which operational amplifiers A1-1 and A2-1 according to the present invention are shared in two operational amplifier circuits 100-1 and 100-2. Due to limitations of space, the single circuit configuration is divided into the four figures of FIGS. 14A, 14B, 14C and 14D. For example, the internal configuration of the operational amplifier A1-1 corresponds to the configuration of FIG. 13, and the internal configuration of the operational amplifier A2-1 corresponds to one obtained from inverting the configuration of FIG. 13. That is, same as the above-described inverting relationship between FIGS. 10 and 11, the differential pairs of the operational amplifier A2-1 correspond to the configuration obtained from changing the differential pairs of the operational amplifier A1-1 of FIG. 13 into a P-channel type.

Figure 15A:
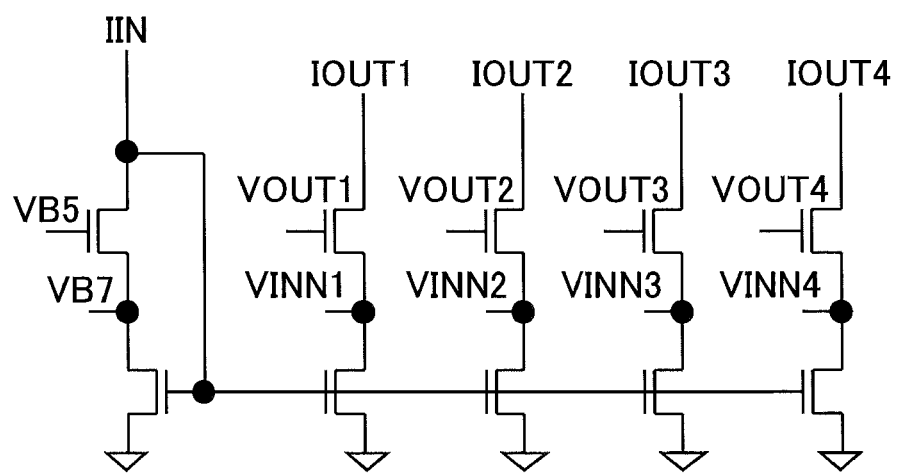
FIG. 15A is a configuration diagram in which an operational amplifier A2-1 (FIG. 15B) is used in four cascode current sources (FIG. 15A).
Figure 15B:
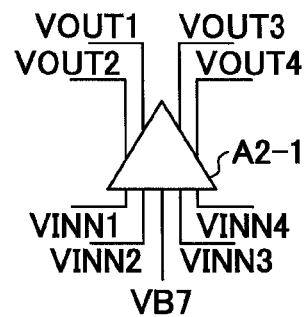
FIG. 15B is a configuration diagram in which the operational amplifier A2-1 (FIG. 15B) is used in four cascode current sources (FIG. 15A).

Further, in a case where there are plural cascode circuits to be gain-boosted, an operational amplifier(s) according to the present invention may be shared by the plural cascode circuits. FIGS. 15A and 15B are a configuration diagram of using an operational amplifier A2-1 obtained from inverting the configuration of FIG. 13 as four cascode current sources. Due to limitations of space, the single circuit configuration is divided into the two figures of FIGS. 15A and 15B.

Figure 16A:
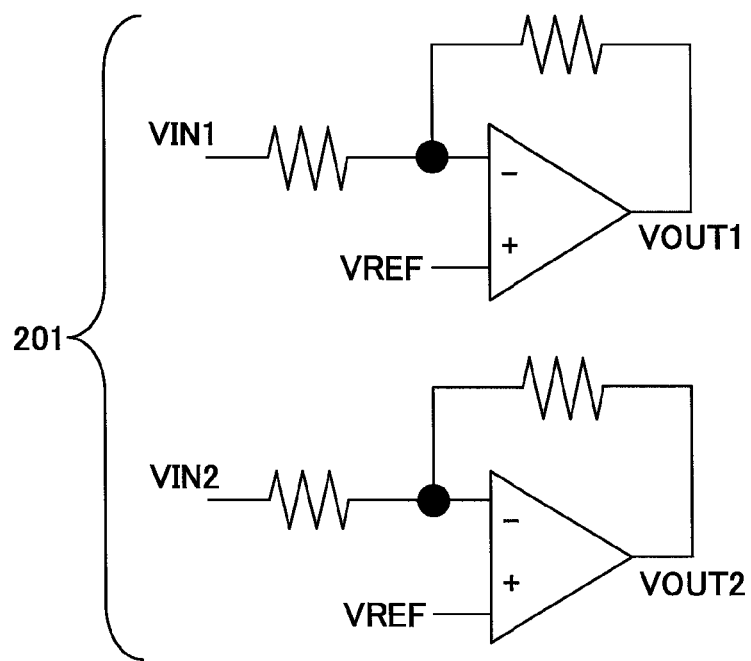
FIG. 16A is one example of an operational amplifier circuit.
Figure 16B:
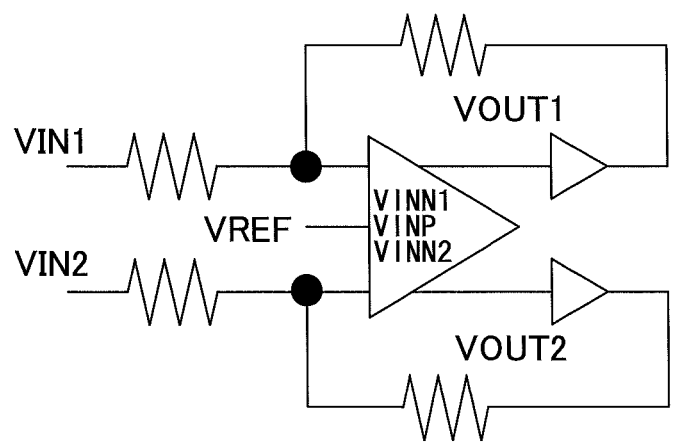
FIG. 16B is one example of an operational amplifier circuit.
Figure 16C:
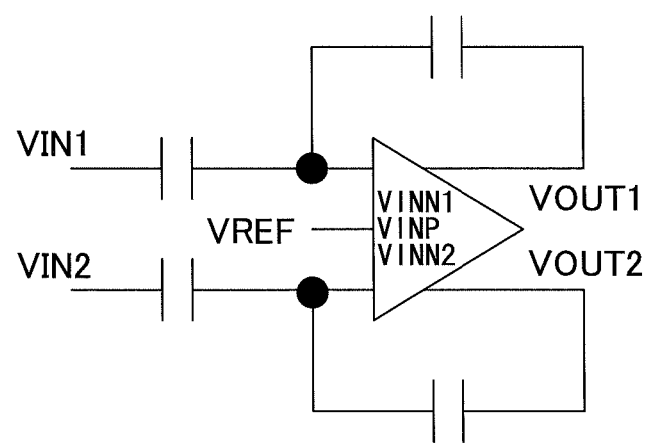
FIG. 16C is one example of an operational amplifier circuit.
Figure 16D:
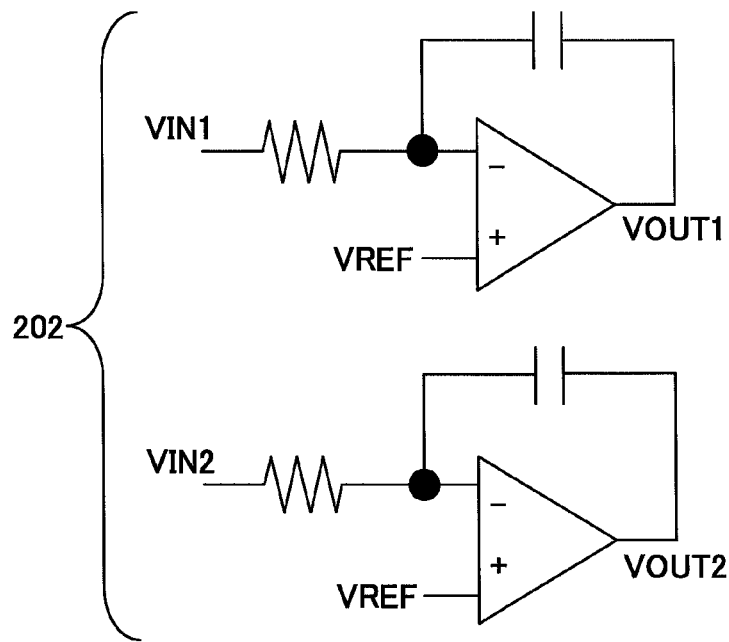
FIG. 16D is one example of an operational amplifier circuit.
Figure 16E:
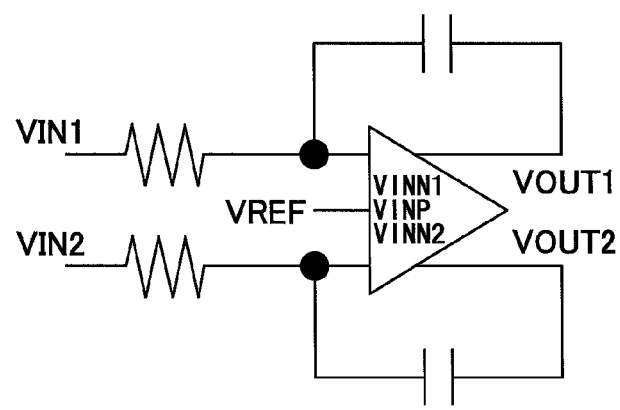
FIG. 16E is one example of an operational amplifier circuit.

Further, as a use other than gain boosting, it is possible to integrate plural operational amplifier circuits that operate using the same reference voltage as a reference into one according to a differential circuit of the present invention. For example, it is possible to integrate two operational amplifier circuits 201 into a single operational amplifier circuit in which output buffers are added for a case of resistance loads (see FIG. 16B). In a case of a filter circuit having capacitance loads, it is possible to integrate into a single operational amplifier circuit without output buffers (see FIG. 16C). Further, for example, it is possible to integrate two RC-type integrators 202 of FIG. 16D into a single operational amplifier circuit (see FIG. 16E).

Figure 17:
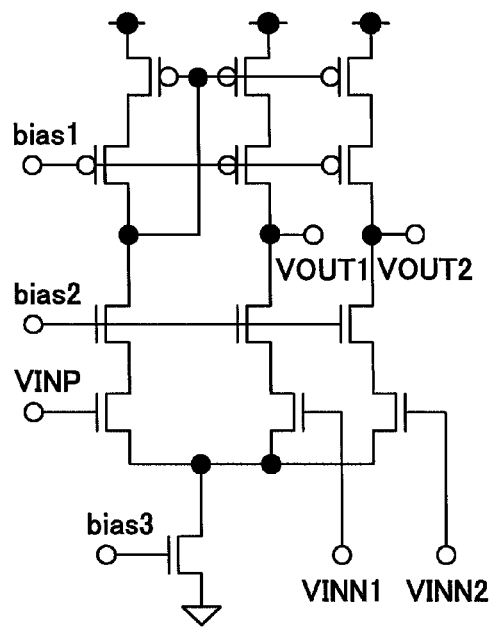
FIG. 17 is a configuration diagram of a telescopic cascode type operational amplifier circuit.
Figure 18:
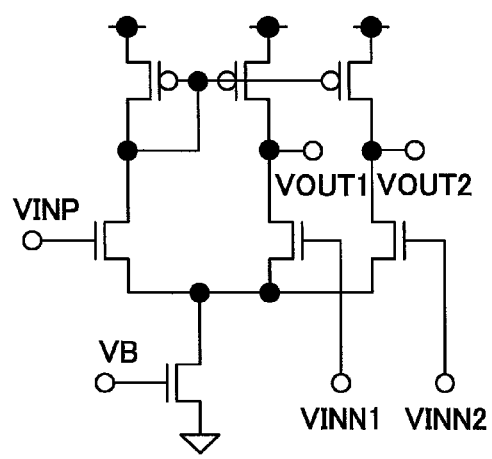
FIG. 18 is a configuration diagram of an operational amplifier circuit including differential pairs and a current mirror.

Further, it is not necessary to limit operational amplifier circuits to a folded cascode type. A differential circuit according to the present invention may be applied to a telescopic cascode type exemplified in FIG. 17, or may be applied to an operational amplifier circuit exemplified in FIG. 18 formed by differential pairs and a current mirror.

The present International Application claims priority based on Japanese Patent Application No. 2010-207235 filed on Sep. 15, 2010, and the entire contents of Japanese Patent Application No. 2010-207235 are incorporated by reference into the present International Application.

DESCRIPTION OF REFERENCE NUMERALS 1, 2 Differential Circuit
14 Differential Input Circuit
16 Differential Output Circuit
18 NMOS Cascode Current Source
20 PMOS Cascode Current Source
22, 24 Differential Input Terminal
26, 28 Differential Output Terminal
36, 40, 48, 52 Feedback Node
38, 42, 50, 54 Control Node
80 Current Source
100, 200 Differential Operational Amplifier Circuit
112 Comparator
114 RS flip-flop
115 Constant-Voltage Circuit
116, 117 Current Circuit
120, 121 Delay Circuit
124, 125 Control Terminal
131, 132, 133 Input Terminal
134, 135 Output Terminal
136 Current Varying Part
137, 138, 139, 140 Circuit Sharing Part
201 Pair of Operational Amplifier Circuits
202 Pair of RC-type Integrators
A1, A2 Operational Amplifier (Boost Amplifier)
C* Capacitor
M* MOSFET
VB* Bias Voltage
* denotes a numeral.

The invention claimed is:

1. A differential circuit comprising:
a first input part to which a first input voltage is input;
a second input part to which a second input voltage is input;
a reference voltage input part to which a reference voltage is input, the reference voltage input part being common to form differential pairs by pairing with respective ones of the first input part and the second input part;
a current source that drives the differential pairs;
a current mirror that generates a first output current and a second output current, according to a current that flows through the reference voltage input part according to at least one voltage difference of a first voltage difference between the first input voltage and the reference voltage and a second voltage difference between the second input voltage and the reference voltage;
a first output part that outputs a signal according to the first voltage difference, according to a current that flows through the first input part according to the first voltage difference and the first output current; and
a second output part that outputs a signal according to the second voltage difference, according to a current that flows through the second input part according to the second voltage difference and the second output current, wherein the differential circuit is used as operational amplifier that increases output impedances of plural cascode circuits of an output stage of an operational amplifier circuit.

2. The differential circuit as claimed in claim 1, wherein the current source has a cascode current source.

3. The differential circuit according to claim 1, used in an integrating circuit.

4. The differential circuit according to claim 1, used in an amplifier circuit.

5. The differential circuit according to claim 1, used in an filter circuit.

6. The differential circuit according to claim 1, used as a comparator.

7. A differential circuit comprising:
a first input part to which a first input voltage is input;
a second input part to which a second input voltage is input;
a reference voltage input part to which a reference voltage is input, the reference voltage input part being common to form differential pairs by pairing with respective ones of the first input part and the second input part;
a current source that drives the differential pairs;
a current mirror that generates a first output current and a second output current according to a current that flows through the reference voltage input part according to at least one voltage difference of a first voltage difference between the first input voltage and the reference voltage and a second voltage difference between the second input voltage and the reference voltage;
a first output part that outputs a signal according to the first voltage difference, according to a current that flows through the first input part according to the first voltage difference and the first output current; and
a second output part that outputs a signal according to the second voltage difference, according to a current that flows through the second input part according to the second voltage difference and the second output current, wherein the differential circuit is used as operational amplifier, and
wherein the differential circuit further comprises:
a first negative feedback circuit provided between the first output part and the first input part; and
a second negative feedback circuit provided between the second output part and the second input part.

8. A differential circuit comprising:
a first input part to which a first input voltage is input;
a second input part to which a second input voltage is input;
a reference voltage input part to which a reference voltage is input, the reference voltage input part being common to form differential pairs by pairing with respective ones of the first input part and the second input part;
a current source that drives the differential pairs;
a current mirror that generates a first output current and a second output current, according to a current that flows through the reference voltage input part according to at least one voltage difference of a first voltage difference between the first input voltage and the reference voltage and a second voltage difference between the second input voltage and the reference voltage;
a first output part that outputs a signal according to the first voltage difference, according to a current that flows through the first input part according to the first voltage difference and the first output current; and
a second output part that outputs a signal according to the second voltage difference, according to a current that flows through the second input part according to the second voltage difference and the second output current, wherein
the first output part and the second output part have cascode current sources.

9. An oscillation circuit, comprising:
a differential circuit including:
a first input part to which a first input voltage is input;
a second input part to which a second input voltage is input;
a reference voltage input part to which a reference voltage is input, the reference voltage input part being common to form differential pairs by pairing with respective ones of the first input part and the second input part;
a current source that drives the differential pairs;
a current mirror that generates a first output current and a second output current, according to a current that flows through the reference voltage input part according to at least one voltage difference of a first voltage difference between the first input voltage and the reference voltage and a second voltage difference between the second input voltage and the reference voltage;
a first output part that outputs a signal according to the first voltage difference, according to a current that flows through the first input part according to the first voltage difference and the first output current; and
a second output part that outputs a signal according to the second voltage difference, according to a current that flows through the second input part according to the second voltage difference and the second output current,
a charging and discharging part that switches charging and discharging of a capacitor according to a control signal, and
a flip-flop that provides an output signal as the control signal to be supplied to the changing and discharging part and outputs an oscillation signal.

* * * * *